(12) United States Patent
Rois

(10) Patent No.: US 9,484,869 B2
(45) Date of Patent: Nov. 1, 2016

(54) TUBE AMPLIFIER SYSTEMS AND RELATED METHODS

(71) Applicant: Brian Rois, St. Louis, MO (US)

(72) Inventor: Brian Rois, St. Louis, MO (US)

( * ) Notice: Subject to any disclaimer, the term of this patent is extended or adjusted under 35 U.S.C. 154(b) by 463 days.

(21) Appl. No.: 13/834,348

(22) Filed: Mar. 15, 2013

(65) Prior Publication Data

US 2014/0266430 A1    Sep. 18, 2014

(51) Int. Cl.
*H03F 3/02* (2006.01)

(52) U.S. Cl.
CPC ............ *H03F 3/02* (2013.01); *Y10T 29/49002* (2015.01)

(58) Field of Classification Search
None
See application file for complete search history.

(56) References Cited

U.S. PATENT DOCUMENTS

| | | | | |
|---|---|---|---|---|
| 2,585,022 A * | 2/1952 | Lewis | ............ | H04M 19/02 379/252 |
| 4,864,245 A * | 9/1989 | Kasha | ............ | 330/65 |
| 5,008,634 A * | 4/1991 | Christian | ............ | 330/306 |
| 7,390,960 B1 * | 6/2008 | Arnold | ............ | 84/735 |
| 7,602,927 B2 * | 10/2009 | Smith | ............ | 381/120 |
| 8,155,348 B2 * | 4/2012 | Bray | ............ | 381/104 |
| 8,204,254 B2 * | 6/2012 | Shannon | ............ | G10H 1/46 381/102 |

OTHER PUBLICATIONS

MI Audio; NAMM Show Jan. 24-27, 2013; 2 pgs.
Image from MI Amplification Facebook page posted Nov. 11, 2012; 1 pg.
Image from MI Amplification Facebook page posted Nov. 14, 2012; 1 pg.

* cited by examiner

*Primary Examiner* — Curtis Kuntz
*Assistant Examiner* — Kenny Truong
(74) *Attorney, Agent, or Firm* — Harness, Dickey & Pierce, P.L.C.

(57) ABSTRACT

An amplifier stage module circuit has a tube connected with an anode section, a grid section, a cathode section, and an attenuator section. The amplifier stage module circuit is configurable to provide any one of a plurality of selectable voices, each voice provided by a corresponding combination of selectively combinable voice components of the sections.

20 Claims, 20 Drawing Sheets

TUBE AMPLIFIER SYSTEMS AND RELATED METHODS

FIELD

The present disclosure relates to tube amplifier systems and related methods.

BACKGROUND

This section provides background information related to the present disclosure which is not necessarily prior art.

Since the invention of the electric guitar, electrical amplification of the sound has been provided by systems utilizing vacuum tubes. Although digital amplifiers are currently available, the use of vacuum tubes in electric guitar amplifiers has endured. Many musicians are of the opinion that tube-based amplifiers provide a feel and responsiveness unavailable through digital amplifiers.

SUMMARY

This section provides a general summary of the disclosure, and is not a comprehensive disclosure of its full scope or all of its features.

In one example embodiment, the present disclosure is directed to an amplifier stage module circuit. A tube is connected with an anode section, a grid section, a cathode section, and an attenuator section. The amplifier stage module circuit is configurable to provide any one of a plurality of selectable voices, each voice provided by a corresponding combination of selectively combinable voice components of the sections.

In another example embodiment, the disclosure is directed to an amplifier system that includes a plurality of user-selectable stage modules. Each stage module has a tube, an anode section, a grid section, a cathode section, and an attenuator section. At least some of the stage modules are combinable to provide a user-selected sound of the amplifier system. Each stage module is configurable to provide any one of a plurality of selectable voices of the stage module. Each voice is provided by a corresponding combination of selectively combinable voice components of the sections.

In yet another example embodiment, the disclosure is directed to a method of making an amplifier system. The method includes configuring a plurality of stage modules, and in a given stage module, providing a plurality of voice components and voice component values for providing a plurality of voices in the given stage module. A given voice component is configurable in the given stage module to provide a first voice component value for a first one of the voices and configurable in the given stage module to provide a second component value for a second one of the voices. A selection switch is provided for selecting one of the voices.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
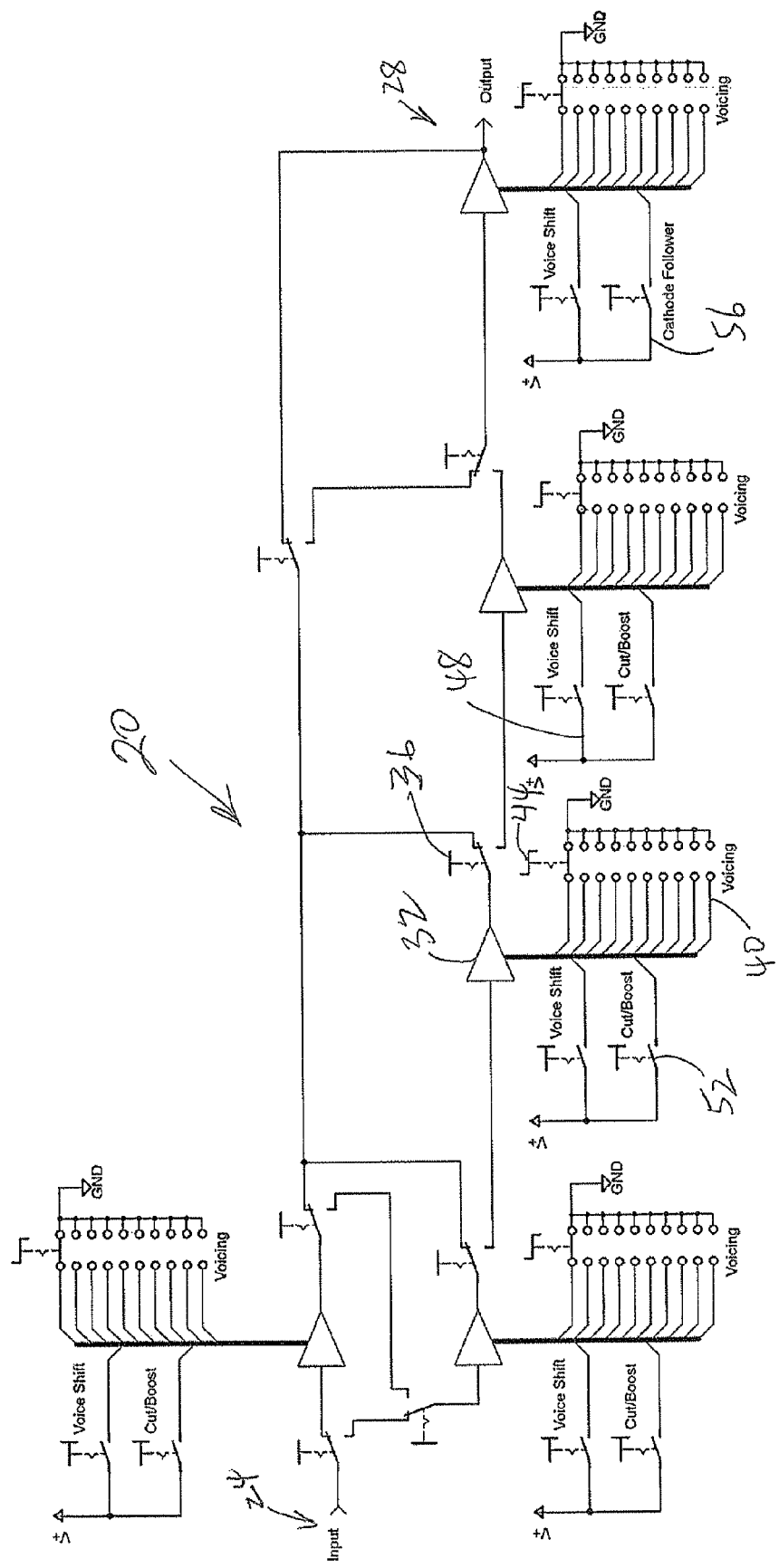
FIG. 1 is a diagram of an amplifier system in accordance with one implementation of the disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

The inventor has observed that there are many tube amplifiers on the market that can be used to produce various types of electric guitar sound. It would be expensive, however, for a musician to acquire multiple amplifiers so as to be able to play the various sounds. Accordingly, various embodiments of the disclosure are directed to systems and methods in which one amplifier system may be used to produce a plurality of sounds. Although various embodiments of the disclosure are discussed with reference to preamplifier stages and preamplifier systems, the disclosure is not so limited. The disclosure could be implemented in various embodiments in relation to other or additional types of amplifiers.

One example embodiment of an amplifier system is indicated generally in FIG. 1 by reference number 20. The system 20 is configured to receive a signal at an input 24 and send a signal at an output 28. One or more stage modules 32 are selectively connectable, e.g., by a user, to configure the amplifier system 20 to provide a desired sound. In the present example embodiment, five stage modules 32 are provided, although substantially any number of stage modules may be provided in other embodiments. In the present example embodiment, each stage module 32 includes a vacuum tube. A user may selectively operate one or more switches 36 to switch each stage module 32 into or out of a configuration of stages to obtain a desired sound from the amplifier system 20. A user may selectively switch stage modules 32 together to obtain a plurality of amplifier topologies, e.g. for parallel input, bridged input, tapped gain designs, dual mode designs, etc.

To obtain a desired sound, a user may select one particular voice to be output by a given amplifier stage. Each stage module 32 of the amplifier system 20 may be selectively configured to output one of a plurality of voices. One or more voice options 40 are provided for selection of a voice therefrom. In the present example embodiment, ten voice options 40 are available for each stage module 32. Any number of voice options 40, however, may be made available for any stage module 32, and different numbers of voice options 40 may be made available for different stage modules 32. For a given stage module 32 selected for inclusion in a desired configuration of the amplifier system 20, the user may operate a rotary switch 44 to select one of the voice options 40 to cause the given stage module 32 to be configured to provide the selected voice. For a given voice option 40, a switch-selectable voice shift option 48 and/or a switch-selectable gain cut/boost option 52 may be provided. A voice shift is a change within a voice and is typically provided by adding one or more capacitors to a voice circuit as further described below. Although mechanical switches are shown for clarity in FIG. 1, it should be noted generally that other or additional types of switches, including but not limited to various types of digital switches, could be used in various embodiments.

In various embodiments, a switch-selectable cathode follower option 56 may be provided for a given stage module 32. Additionally or alternatively, a cathodyne phase inverter output stage (not shown) may be automatically switched into the amplifier system 20 circuit before the cathode follower to drive the cathode follower output stage when an odd number of tubes are selected. The cathodyne phase inverter stage provides no gain but inverts the amplifier signal, thereby bringing the output signal back into phase with the input signal.

Figure 2:
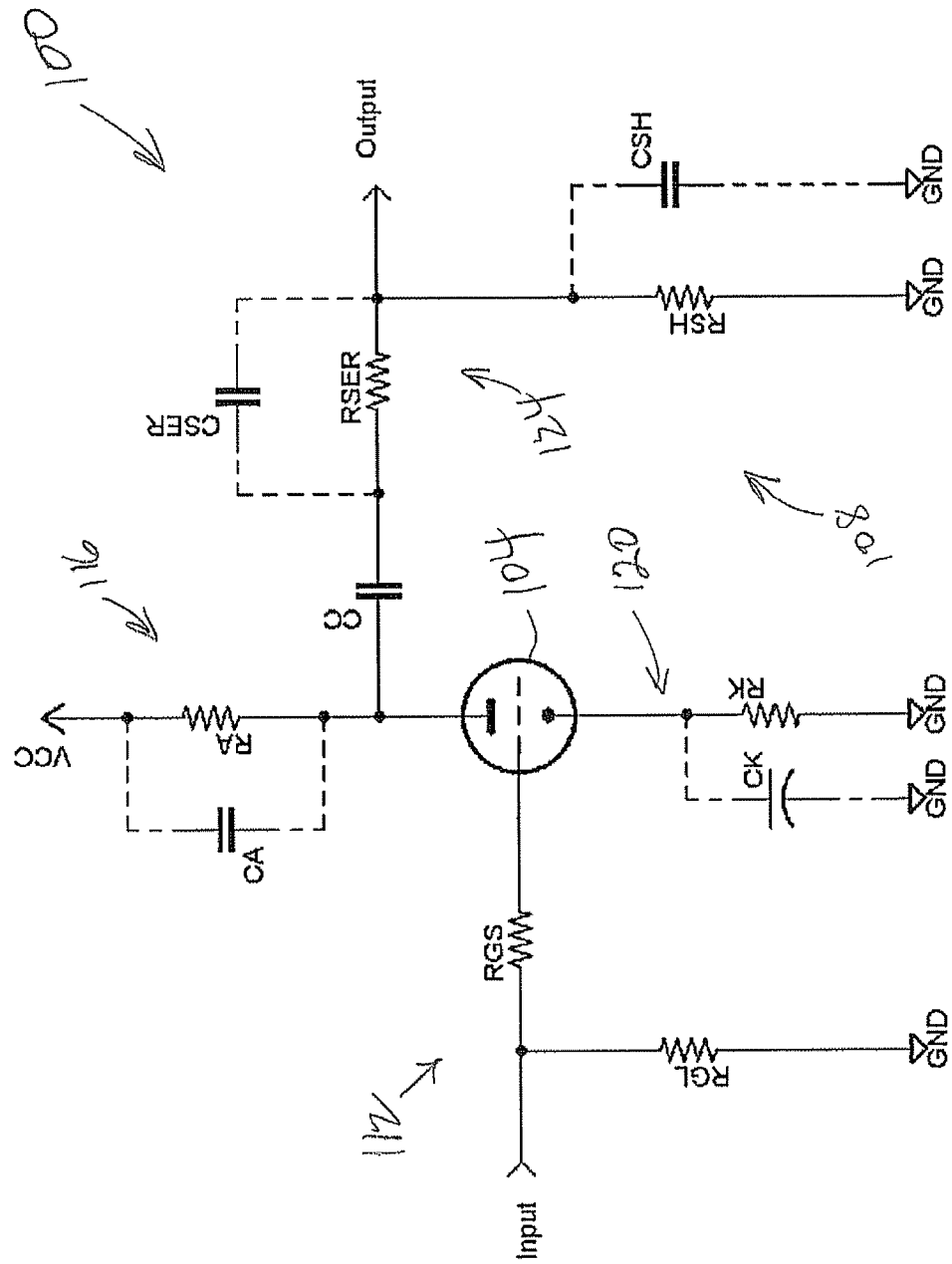
FIG. 2 is a diagram of a common cathode stage.

In the amplifier system 20, each stage module 32 is configured as a common cathode stage. One example of a common cathode stage is indicated generally in FIG. 2 by reference number 100. The common cathode stage 100 has a single vacuum tube 104 and a plurality of sections 108 including a grid section 112, an anode section 116, a cathode section 120, and an attenuator section 124.

The grid section 112 includes a grid leak resistor RGL, which may set input impedance for the stage and keeps the tube 104 grid at ground potential. A grid stop resistor RGS may dampen high-frequency oscillation and can be used to shape a tone of the stage with the internal capacitance of the tube 104. The anode section 116 includes an anode resistor RA and may optionally include a bypass capacitor CA. The cathode section 120 includes a cathode resistor RK and an optional bypass capacitor CK. Resistors RA and RK set the bias for the tube. Even small changes in bias can change amplifier tone. RA defines a range of current that the tube 104 is capable of drawing. A small voltage drop across RK places the tube 104 cathode at a higher voltage than the tube 104 grid. This typically stabilizes voltages around the tube 104 as current through the tube is held constant. When an input signal is received, the tube 104 is forced to draw more or less current, causing a large, changing voltage drop across the anode resistor RA. An inverted version of the input signal is produced. A small change in voltage at the tube 104 grid typically causes a large change in voltage at the tube 104 anode, making possible large gains of, e.g., 30 dB and higher.

The attenuator section 124 includes a coupling capacitor CC to keep high DC voltages needed by the tube 104 local and to keep a following stage at ground potential. If CC is small, it can be used to reduce low-frequency signal content. Resistors RSER and RSH form an attenuation network to lower the signal voltage to a usable level. The resistor RSH may also be used as a grid-leak resistor for a following stage if any.

The optional capacitors CA, CK, CSER and CSH can be used to shape a frequency response of the stage 100. The capacitor CK and resistor RK typically cooperate to maximize amplifier gain. If CK is large, all frequencies typically are maximized equally. Smaller CK values allow the tube 104 to amplify high frequencies more than low frequencies. The capacitor CA may be used to reduce gain at high frequencies as it allows those frequencies to bypass the resistor RA (and amplification by the tube 104.) The capacitor CSER allows high frequencies to bypass the resistor RSER so that they are not attenuated. The capacitor CSH shunts high frequencies to ground and creates a high frequency roll off. The capacitor CSH can be used instead of the capacitor CA to do the same thing, i.e., reduce gain at high frequencies.

The tube 104 may be overdriven in one of two ways: grid clipping, and driving the tube 104 to cutoff. Each method produces a different spectrum of harmonics. In some embodiments of the disclosure, a user may selectively configure a stage module 32 to distort an input signal by changing tube bias to overdrive a tube to distort an input signal in various ways.

In various embodiments, the common cathode stage sections 108 form a basis for configuring a stage module 32 to produce any one of a plurality of voices. As further described below, in various embodiments a stage module 32 includes voice components for providing each of a plurality of voices. Selection by a user of a voice option 40 actuates one or more switches, e.g., relays, of the stage module 32 to configure a corresponding combination of the voice components in the stage module 32 so as to provide circuit values that correspond to the selected voice option 40. The stage module 32 is thereby configured to produce the desired voice when the amplifier system 20 is amplifying.

Various methods of configuring a stage module in accordance with various implementations of the disclosure shall now be discussed with reference to FIGS. 3, 4 and 5. It should be noted that implementations of the methods are not necessarily mutually exclusive, and that various aspects of each may be combined in other or additional methods of configuring a stage module in accordance with the present disclosure.

Figure 3:
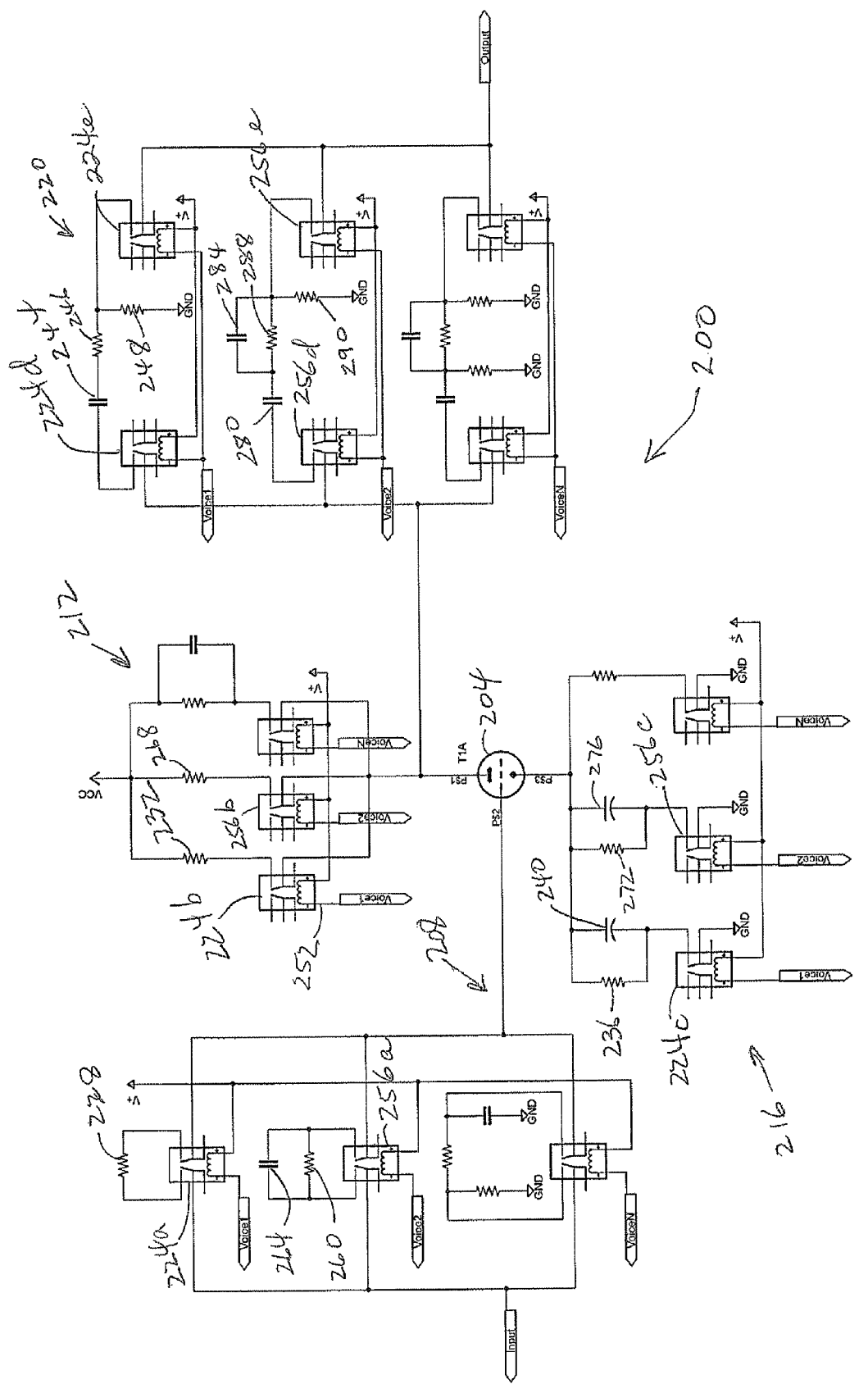
FIGS. 3-5 are diagrams of stage modules configured in accordance with various implementations of the disclosure.

One example embodiment of a stage module is indicated generally in FIG. 3 by reference number 200. To configure a stage module in the same or similar manner as the module 200 (referred to herein as having a "modular design,") typically it is first decided which voice(s) to include in the stage module. A number of popular, "classic" amplifiers provide well-known sounds and, in various embodiments, may serve as models for amplifier system voices and/or sounds. Thus, in one example implementation, an individual stage of a known amplifier model may be analyzed and provided as a selectable voice in a stage module that includes, e.g., a plurality of selectable voices.

Referring again to FIG. 3, the example stage module 200 has a tube 204, a grid section 208, an anode section 212, a cathode section 216, and an attenuator section 220. The stage module 200 is capable of producing any one of a plurality of, e.g., three, voices, e.g., Voice1, Voice2 and VoiceN. Only one voice may be produced at any one time. Each voice is switchable into the stage module 200 through switching of corresponding relay(s). For example, Voice1 is configurable through relays 224a, 224b, 224c, 224d and 224e. Each voice is provided through a plurality of voice components. For example, when relays 224a, 224b, 224c, 224d and 224e are closed, Voice1 is configured through a grid resistor 228, an anode resistor 232, a cathode resistor 236 and capacitor 240, an attenuator coupling capacitor 244, and attenuator resistors 246 and 248. Referring to FIG. 1, when a user selects a voice option 40, e.g., for Voice1, relays 224a, 224b, 224c, 224d and 224e are actuated together. Specifically and for example, negative terminals 252 of the relays 224a, 224b, 224c, 224d and 224e are connected together into a bus, thereby allowing Voice1 to be controlled by a single switch, e.g., as discussed with reference to FIG. 1.

Voice2 and VoiceN are configured through their corresponding voice components in a manner similar to that described for Voice1. For example, when relays 256a, 256b, 256c, 256d and 256e are actuated, Voice2 is configured through a grid resistor 260 and capacitor 264, an anode resistor 268, a cathode resistor 272 and capacitor 276, an attenuator coupling capacitor 280, a capacitor 284, and attenuator resistors 288 and 290.

When a voice is not being used, its components are fully removed from the stage module 200 circuit. In this way, any one of the voices (Voice1, Voice2, VoiceN) can be isolated from the other voices when that one voice is being produced through the stage module 200. Voice shifts and/or cuts may be added into the stage module 200 in the same or similar manner. Thus a voice shift or cut circuit for a given voice may be provided in, and isolated with, the circuit for the given voice. Voice shift and cut circuits have relays connected to form a bus. When, however, a voice shift has been selected by a user for a voice that is active, only the voice shift for the active voice is active, even though other voice shift components may also be switched into the circuit.

Figure 4:
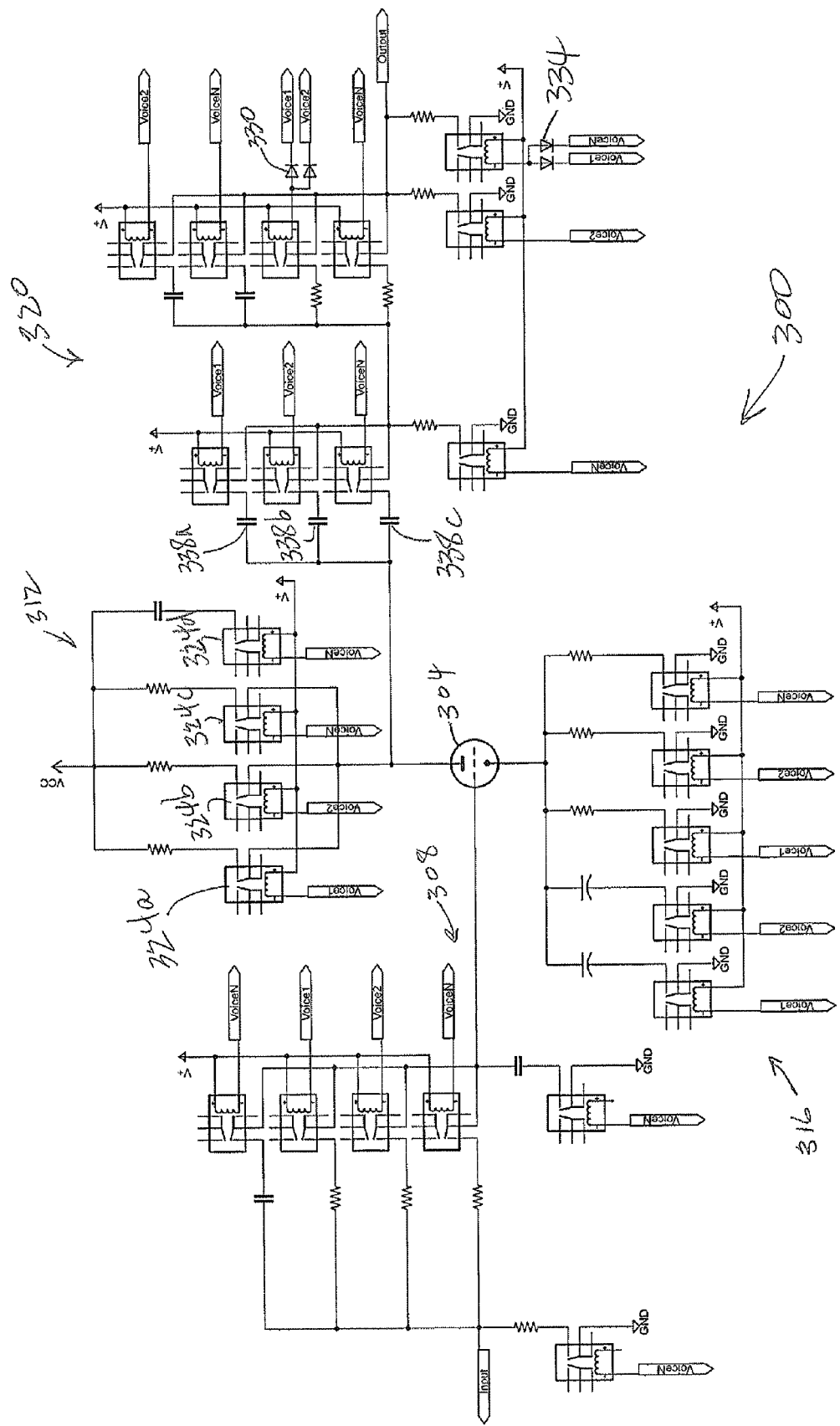

A schematic of another example embodiment of a stage module is indicated generally in FIG. 4 by reference number 300. The stage module 300 is configured to provide the same voices as those provided in the stage module 200 of FIG. 3. To configure a stage module in the same or similar manner as the module 300 (referred to herein as having a "banked component design,") it is decided which voices to include in the stage module. Then all of the voice components are identified for all of the voices, e.g., so as to avoid duplicating components and to provide individual control of each component.

Referring again to FIG. 4, the stage module 300 has a tube 304, a grid section 308, an anode section 312, a cathode section 316, and an attenuator section 320. The stage module 300 is capable of producing any one of Voice1, Voice2 and VoiceN. As in the module 200, each voice is configurable in the stage module 300 through actuation of a set of relays, collectively referred to by reference number 324, that form a bus corresponding to the voice. It should be noted that almost every voice component of the stage module 300 has its own relay 324 to switch that component in or out of the stage module 300 circuit. In contrast, in the stage module 200 (shown in FIG. 3,) a relay may be shared by two components of the same voice. For example and referring to FIG. 3, the cathode resistor 272 and capacitor 276 of Voice2 are both switched into or out of the stage module 200 circuit by the relay 256c. In the stage module 300 of FIG. 4, where a component is shared among voices, diodes may be used to isolate common busses. For example, in the attenuator section 320, diodes 330 act as OR gates to isolate Voice1 and Voice2 from each other. Diodes 334 are used as OR gates to isolate Voice1 and VoiceN from each other.

Unlike the stage module 200 of FIG. 3, the stage module 300 of FIG. 4 does not include duplicate voice components. Adding voices to a stage module like that of FIG. 4 is facilitated, e.g., where (instead of each relay being connected to a bus) a microprocessor is used to control each relay. Such an arrangement allows each voice component to be independently switched into or out of a module. On the other hand, such a configuration may tend to include a large number of relays, which may be expensive relative to resistors and capacitors. Large numbers of relays also may result in a complicated layout. As shown in FIG. 4, the anode section 312 may be a high DC environment. Coupling capacitors 338a, 338b and 338c are in provided in parallel to avoid using a large hardwired capacitor, and they keep the high DC voltage from the relays that switch them in and out of the circuit.

Figure 5:
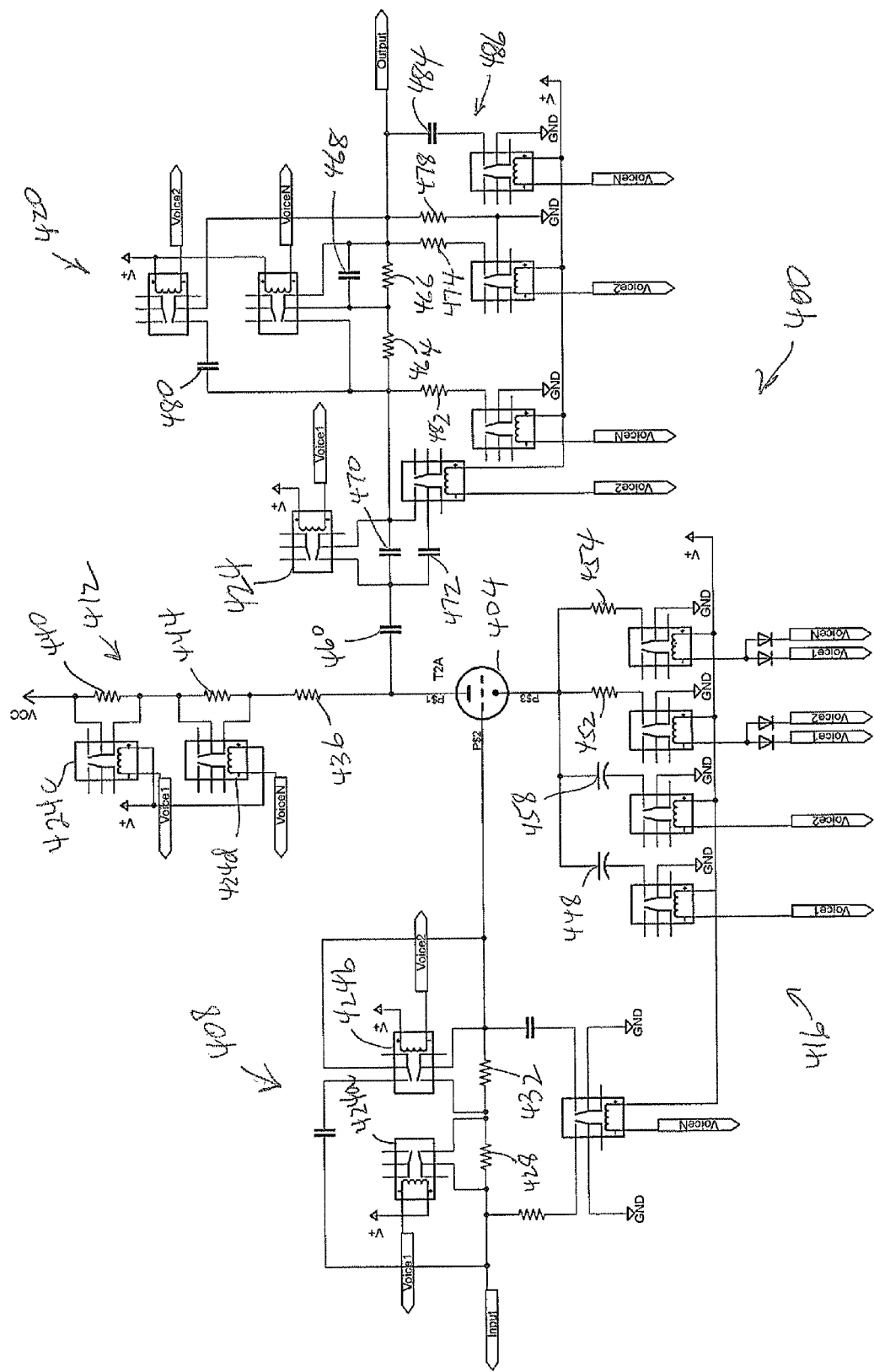

A schematic of another example embodiment of a stage module is indicated generally in FIG. 5 by reference number 400. The stage module 400, which is referred to herein as having a "hybrid design," is configured to provide the same voices as those provided in the stage modules 200 and 300 of FIGS. 3 and 4. The stage module 400 has a tube 404, a grid section 408, an anode section 412, a cathode section 416, and an attenuator section 420. The stage module 400 is capable of producing any one of Voice1, Voice2 and VoiceN. As in the modules 200 and 300, each voice is configurable in the stage module 400 through actuation of a set of relays, collectively referred to by reference number 424, that form a bus corresponding to the voice.

To configure a stage module in the same or similar manner as the module 400 shown in FIG. 5, it is decided which voices to include in the stage module. Circuit values then are identified that would provide all of the voices in the stage module. Voice components may be determined that provide the identified circuit values. Notably, a given voice component may provide and/or contribute to a plurality of the circuit values and may be included in circuits for more than one of the voices.

In various embodiments, voice components may be connected in parallel and/or in series to provide multiple circuit values. A given section of a stage module may be amenable to providing desired circuit values through particular types of voice component combinations. Dependent on the particular case, grid and attenuator sections can be amenable to use of series resistors in series portions of such sections and use of parallel resistors in shunt portions. Emphasis and de-emphasis capacitors may lend themselves best to parallel configurations. The grid section 408, for example, includes a resistor 428 switchable by a relay 424a into or out of the stage module 400 to provide a resistance value for Voice1. The grid section 408 also includes a resistor 432 switchable by a relay 424b into or out of the stage module 400 to provide a resistance value for Voice2. To provide a resistance value for VoiceN, both resistors 428 and 432 in series are switched into the stage module 400 by turning the relays 424a and 424b off.

In the anode section 412, a hardwired resistor 436 is included in the module 400 circuit for all three voices. For Voice1, a resistor 440 is switched by a relay 424c into the module 400 circuit and its resistance is added to that of the hardwired resistor 436. For VoiceN, a resistor 444 is switched by a relay 424d into the module 400 circuit and its resistance is added to that of the hardwired resistor 436. This arrangement reduces voltage stress on the relays since the relay is only switching a portion of the voltage from VCC to Va. If it were done in the same way as shown in FIG. 4, the relays would see all of Va.

In the cathode section 416, a capacitor 448 and resistors 452 and 454 are configurable in parallel to provide circuit values for Voice1. In the present example embodiment the resistors 452 and 454 have higher resistance values compared to the desired circuit resistance value for the cathode section 416, in order to provide the lower desired resistance value when configured in parallel. A capacitor 458 and the resistor 452 are configurable in parallel to provide circuit values for Voice2. The resistor 454 is switched into the module 400 circuit to provide a resistance value for VoiceN.

In various implementations of the disclosure, configuring a stage module to emulate a plurality of model voices includes configuring the attenuator section of the stage module to provide, for each voice, the same attenuation, the same emphasis and de-emphasis frequencies, and the same load, if any, on a previous stage as provided in the model. Further, configuring the stage module includes simplifying the stage module attenuator section in ways that accommodate all of the model attenuators.

In the attenuator section 420, a hardwired coupling capacitor 460 is provided for all three voices. Series/parallel combinations of voice components may be suitable for inclusion in combination with the coupling capacitor 460. For Voice1, a resistor 464 is provided in series with a parallel configuration of a resistor 466 and capacitor 468. The capacitor 468, which is an emphasis capacitor, is hardwired across the resistor 466 and may be used for additional voices in another embodiment of the stage module 400. For Voice2, the stage module 400 circuit includes parallel capacitors 470 and 472 in series with parallel resistors 474 and 478, and also a capacitor 480 in parallel with the resistor 464 and parallel combination of resistor 466 and capacitor 468. For VoiceN, the capacitor 470, a resistor 482, the resistor 464, resistor 466 and capacitor 468, and a capacitor 484 are switched into the module 400 circuit.

Many preamplifier designs include very high values of capacitance and also include several smaller capacitors. Since higher capacitance values typically pass frequencies below 100 Hz, a difference, e.g., of 47 nF or 22 nF would not be important. However, a smaller, e.g., 2.2 nF, capacitor may pass frequencies above 700 Hz, whereas a 4.7 nF capacitor may pass frequencies above 300 Hz, which may be noticeable in an amplifier sound. In the stage module 400, a typical large value for the fixed coupling capacitor 460 may be, e.g., 22 NF. Smaller capacitors may be, e.g., configured in series with the larger capacitor and in parallel with themselves.

It should be noted that a voice component and/or circuit value that typically may be provided in one stage section may be provided instead in another section of the stage, e.g., where doing so does not substantially change the module output relative, e.g., to a model being emulated. For example, in the module 400 no anode bypass capacitor is provided, but instead the capacitor 484 is provided in a shunt portion 486 of the attenuator section 420. The capacitor 484 is scaled in value to provide an appropriate frequency response.

Configuring a stage module in the same or similar manner as the module 400 shown in FIG. 5 can be advantageous, e.g., in that fewer relays and other components typically are used, with little or no duplication, than in other methods. This advantage becomes more evident as more voices are added to a stage module. Additionally, stress on relays from high voltages can be reduced, and PCB/physical component layout can be cleaner.

In accordance with various implementations and as previously discussed, a plurality of classic amplifier models may be emulated as selectable voices in a stage module. The inventor has observed that the emulation of classic models as voices in a single stage module can be facilitated by the fact that various classic amplifier stages tend to have a number of circuit values in common. In one example method of configuring a stage module, circuit values are first determined for anode and cathode resistors. Secondly, circuit values are determined for loading and attenuation. In some implementations, once resistances common to the models in the various sections are determined, diodes may be included to operate as OR gates for relays as previously discussed with reference to FIG. 4.

Figure 6A:
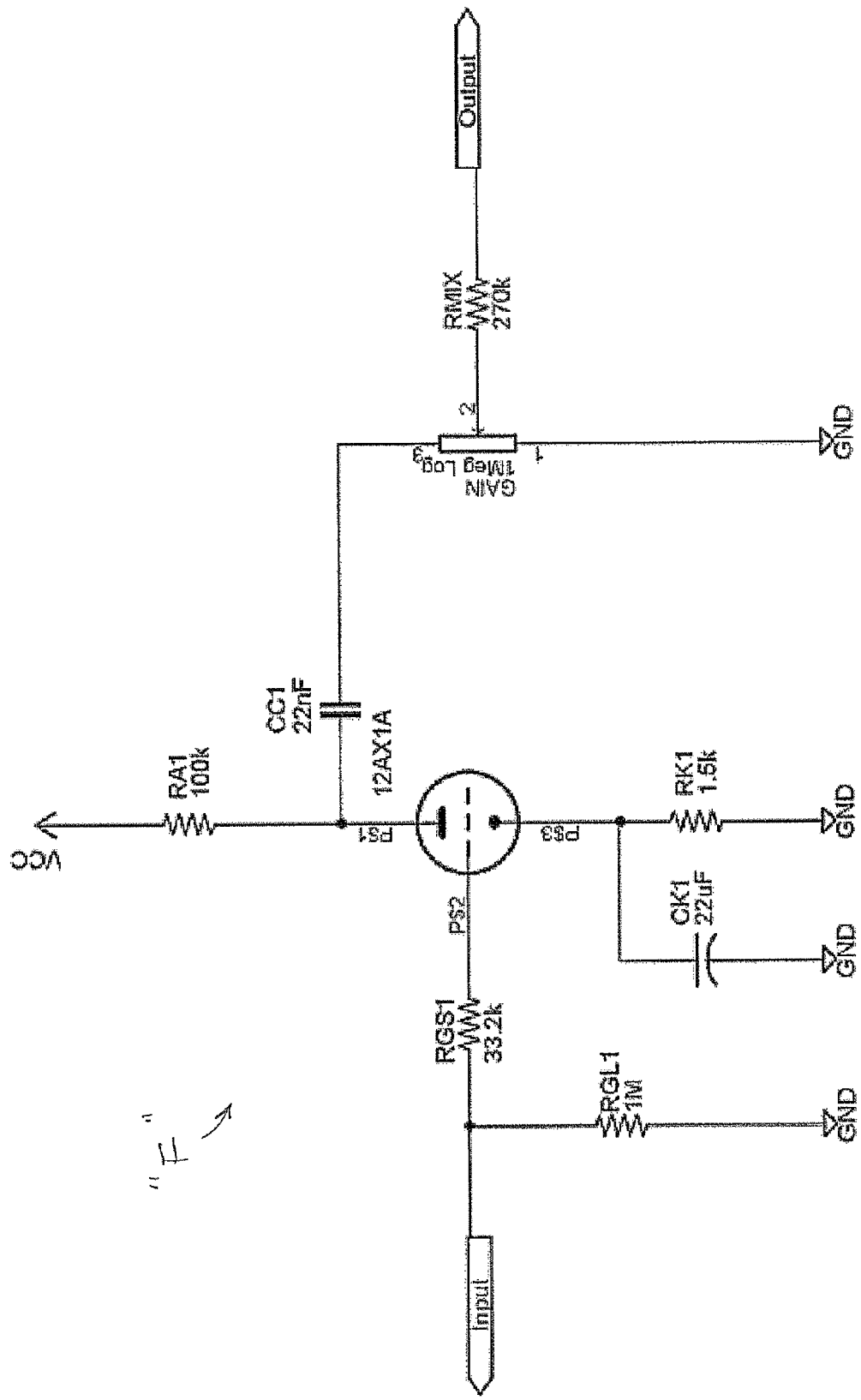
FIGS. 6A-6B are diagrams of known amplifier stages.
Figure 6B:
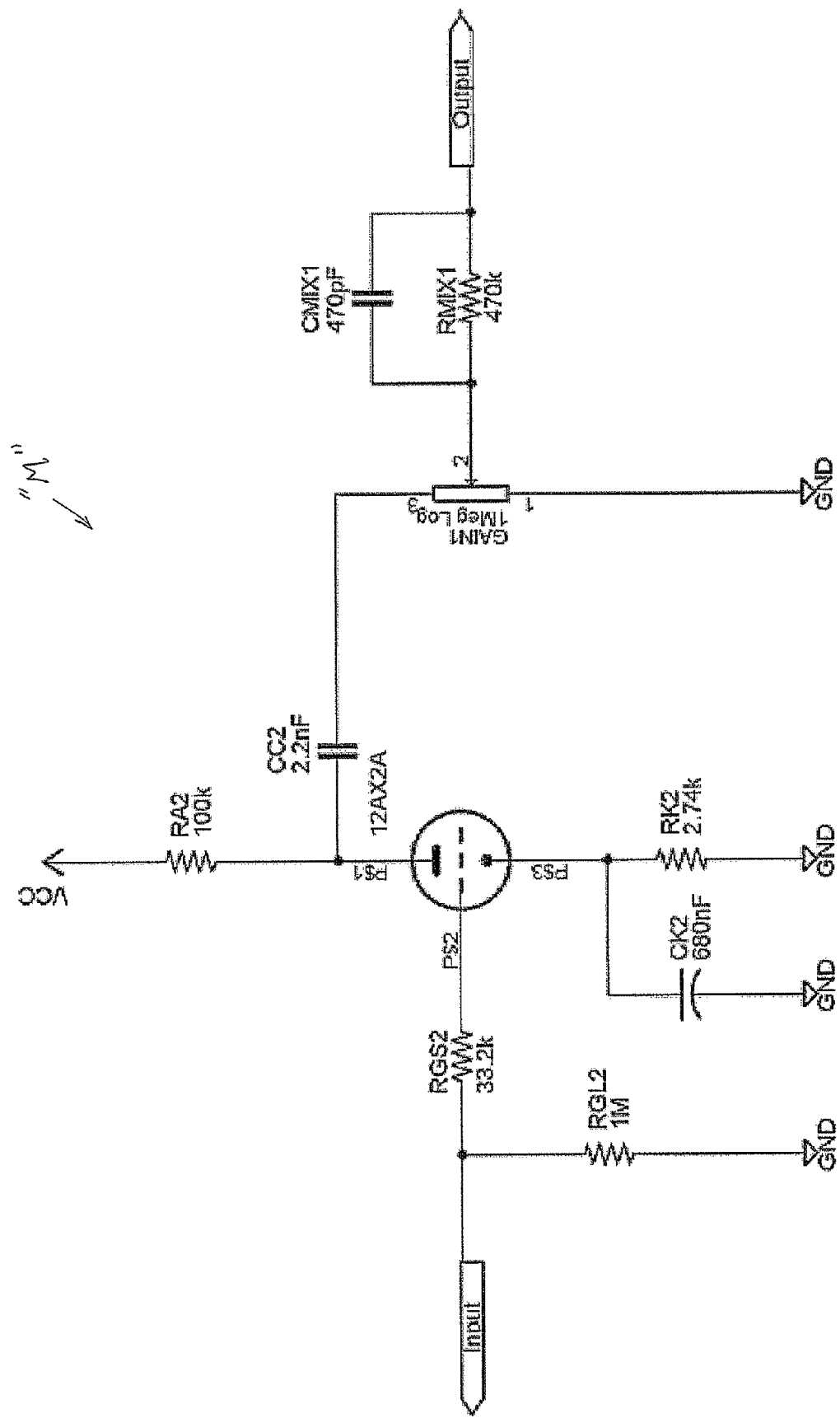
Figure 6C:
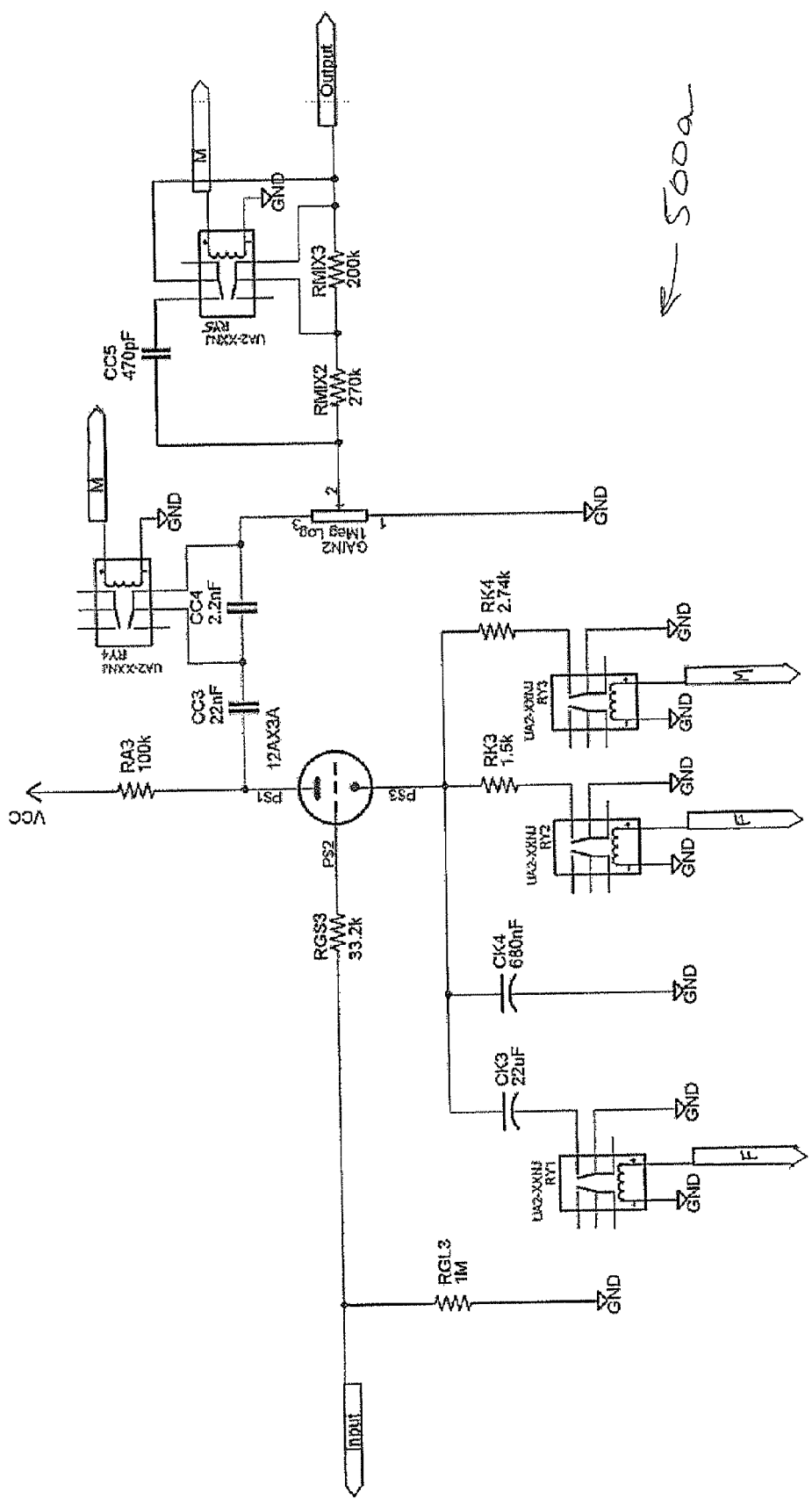
FIG. 6C is a diagram of a stage module configured in accordance with one implementation of the disclosure.

One example method of emulating model voices in a stage module shall now be described with reference to FIGS. 6A-6E. A known stage model "F" is shown in FIG. 6A, and a known stage model "M" is shown in FIG. 6B. The two models "M" and "F" are included as two alternative voices in a stage module indicated in FIG. 6C by reference number 500a. Grid leak resistors RGL1 of the model "F" and RGL2 of the model "M" have the same value, e.g., 1 MΩ. Grid stop resistors RGS1 of the model "F" and RGS2 of the model "M" also have the same value, e.g., 33.2 kΩ. Accordingly, a 1 MΩ grid leak resistor RGL3 and a 33.2 kΩ grid stop resistor RGS3 are provided, e.g., hardwired, in the stage module 500a. Similarly, the model anode resistors RA1 of the model "F" and RA2 of the model "M" have the same value, e.g., 100 kΩ, and so a 100 kΩ anode resistor RA3 is provided in the stage module 500a. Cathode resistor RK1 of the model "F" has a value, e.g., of 1.5 kΩ and cathode resistor RK2 of the model "M" has a value, e.g., of 2.74 kΩ. Both values are included in the module 500a in a 1.5 kΩ cathode resistor RK3 and a 2.74 kΩ cathode resistor RK4.

Cathode bypass capacitor CK1 of the model "F" has a value, e.g., of 22 uF. Cathode bypass capacitor CK2 of the model "M" has a value, e.g., of 680 nF. In the module 500a, a 22 uF capacitor CK3 and a 680 nF capacitor CK4 are provided. CK4 is hardwired to ground. Capacitances are additive in parallel, and a value of 22 uF puts low-frequency roll-off well below the lowest note of a guitar. With the added 680 nF, roll-off drops even further, to a level that is inaudible. Since both model cathode resistors RK1 and RK2 are bypassed, there is no need to provide a relay for CK4 in the module 500a.

Values of coupling capacitor CC1 of the model "F" and coupling capacitor CC2 of the model "M" are included as a 22 nF capacitor CC3 and a 2.2 nF capacitor CC4, which are placed in series in the module 500a. The capacitors CC3 and CC4 could be placed in parallel in another embodiment. In the present example embodiment, however, the larger capacitor CC3 is hardwired, and so it blocks DC. Advantageously, only the capacitor CC3 needs to be rated for the supply voltage VCC, and so the capacitor CC4 and other capacitors in the module 500a can be lower voltage components. Capacitors in series provide a capacitance value less than that of the smallest capacitor. When the smaller capacitor CC4 is placed in series with the 22 nF capacitor CC3, the combined capacitance is about 2.2 nF.

The two models "F" and "M" each have mixing components. A mix resistor RMIX of the model "F" has a value of, e.g., 270 kΩ. A mix resistor RMIX1 of the model "M" has a value of, e.g., 470 kΩ. In the present example embodiment the larger 470 kΩ circuit value is split into two circuit values of 270 kΩ and 200 kΩ. In the module 500a, two resistors RMIX2 and RMIX3 respectively having circuit values of 270 kΩ and 200 kΩ are provided. A relay RY5 is provided that is switched off to provide the model "F" voice. When the relay RY5 is switched on to provide the model "M" voice, it switches in both resistors RMIX2 and RMIX3 to provide the 470 kΩ circuit value for the model "M" voice. Also switched in is a capacitor CC5, which provides in the module 500a the 470 pF circuit value provided by a capacitor CMIX1 in the model "M" to allow high frequencies to bypass the 470 kΩ resistance.

Figure 6D:
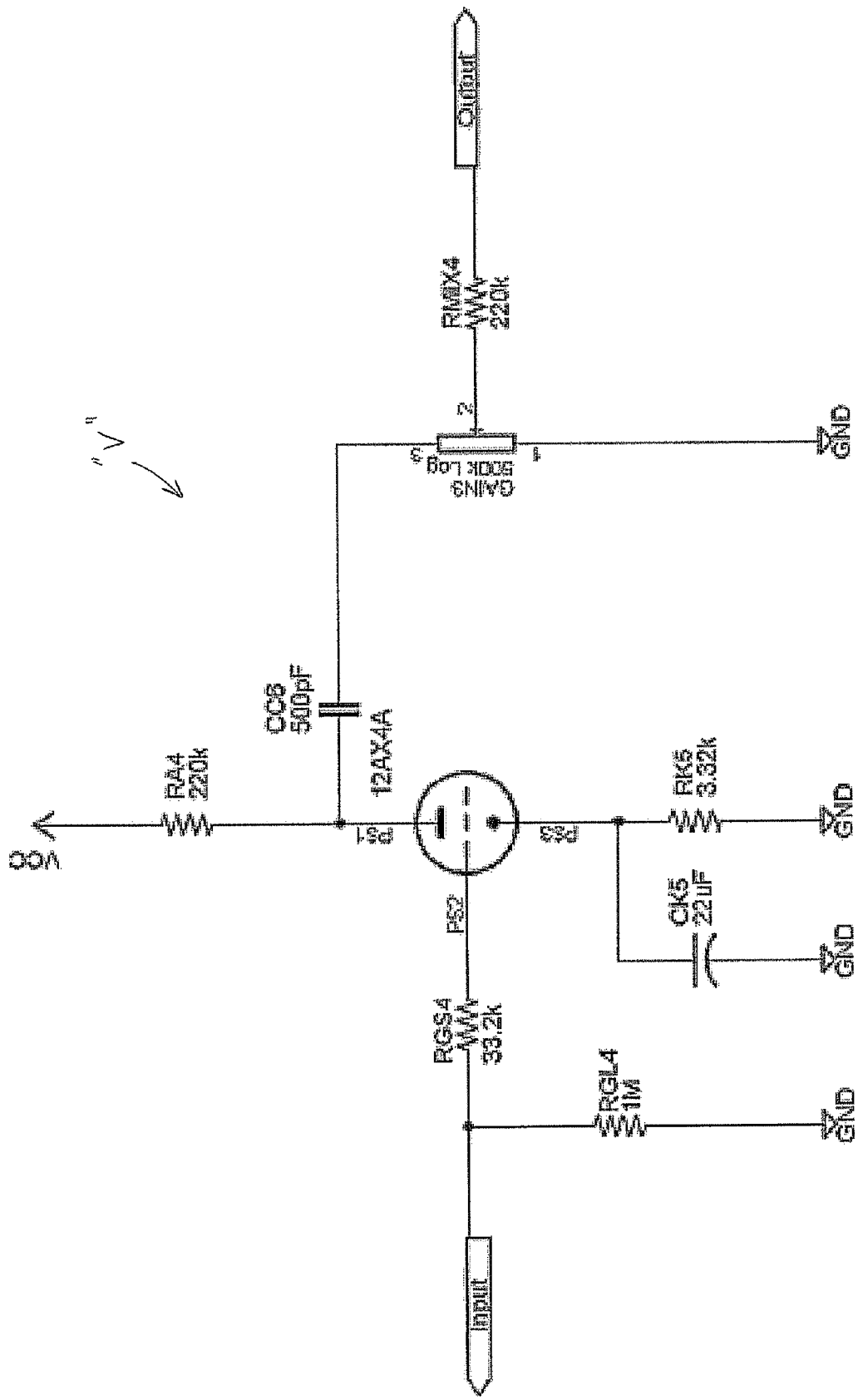
FIG. 6D is a diagram of a known amplifier stage.
Figure 6E:
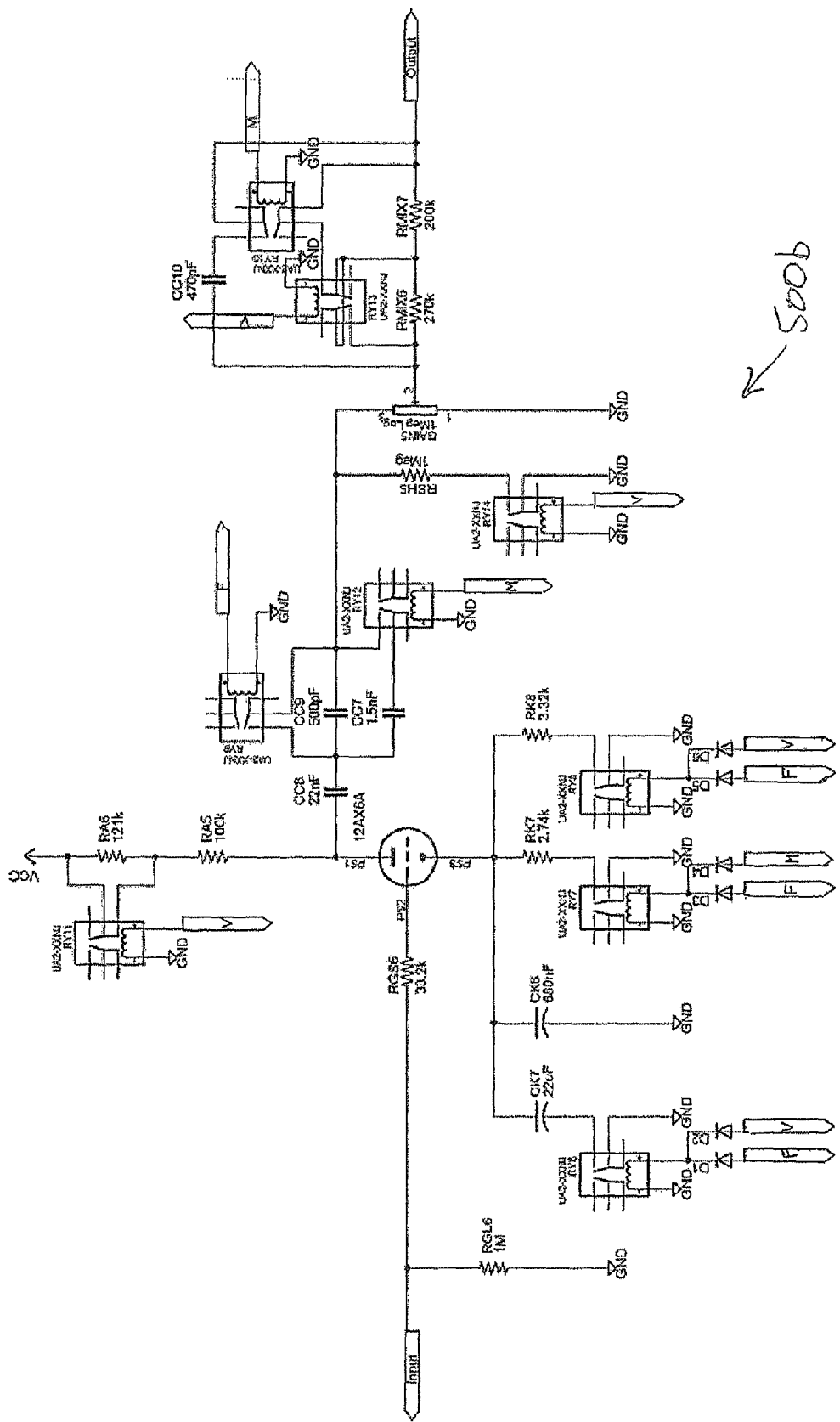
FIG. 6E is a diagram of a stage module configured in accordance with one implementation of the disclosure.

In accordance with one example implementation, a third known stage model also may be included as a voice in the stage module 500a, e.g., as shown in FIGS. 6D-6E. A known stage model "V" is shown in FIG. 6D. As shown in FIG. 6E, circuit values for emulating the third model "V" may be added as a third voice to the module 500a to obtain a three-voice module referred to in FIG. 6E by reference number 500b. The configuring may be performed, e.g., as follows.

The module 500a has a 100 kΩ anode resistor RA3. The model "V" includes a 220 kΩ anode resistor RA4. A second anode resistor is added to the module 500a to include the circuit value of the resistor RA4 in the model "V." The module 500b has two anode resistors RA6 and RA5. The resistor RA5 has the same circuit value of 100 kΩ as the anode resistor RA3 of the module 500a. The resistor RA6 has a resistance of 121 kΩ and is in series with the resistor RK5. The resistor RK6 may be switched out of the module 500b circuit by a relay RY11 to provide the "F" voice or the "M" voice. The resistor RK6 may be switched into the module 500b circuit to provide the "V" voice. A series connection can be advantageous in this configuration. It can make it unnecessary for the relay RY11 to switch the full supply voltage VCC or plate voltage Va, thereby keeping operation of the relay RY11 within its operating capability.

The model "V" includes one cathode resistor, i.e., a 3.32 kΩ anode resistor RK5. This resistance value is included in the module 500b as a cathode resistor RK8. Although the module 500a shown in FIG. 6C has a 1.5 kΩ cathode resistor RK3, the module 500b of FIG. 6E has a second cathode resistor RK7 that has a 2.74 kΩ resistance value. A relay RY7 switches the resistor RK7 into the module 500b circuit for the "M" voice, and a relay RK8 switches the resistor RK7 into the module 500b circuit for the "V" voice. When the two parallel resistors RK7 and RK8 are switched on, they provide an effective resistance value of 1.498 kΩ, which is substantially the appropriate resistance value for providing the "F" voice.

The model "V" has a 500 pF coupling capacitor CC6. The capacitor has a lower value than the coupling capacitors CC3 and CC4 of the module 500a. Thus a 500 pF coupling capacitor CC9 is wired in series with the 22 nF capacitor CC8 to provide the "V" voice, and can be switched into a parallel configuration with the 1.5 nF capacitor CC7 to provide the "M" voice. Both capacitors CC7 and CC9 can be switched out of the module 500b circuit to provide the "F" voice. For the "V" voice, a relay RY14 switches a 1 MΩ resistor RSH5 across a system volume control (not shown in FIG. 1) to effectively make it operate as a 500 kΩ potentiometer when activated.

Mix section resistance may be handled in various ways to obtain suitable resistance values for emulating the model "V" as a voice in the module 500b. For example, a 1.2 MΩ resistor could be placed in parallel with the 270 kΩ resistor RMIX2 of the module 500a. Alternatively, the 270 kΩ resistance could be provided as a 221 kΩ resistor and a 50 kΩ resistor. A third option is shown in FIG. 6E, i.e., adding a relay RY13 to switch the 270 kΩ resistor RMIX6 out of the module 500b circuit for the "V" voice. Although a slightly brighter voice than that of the model "V" might result, using the third option may save a component and layout space.

Figure 7:
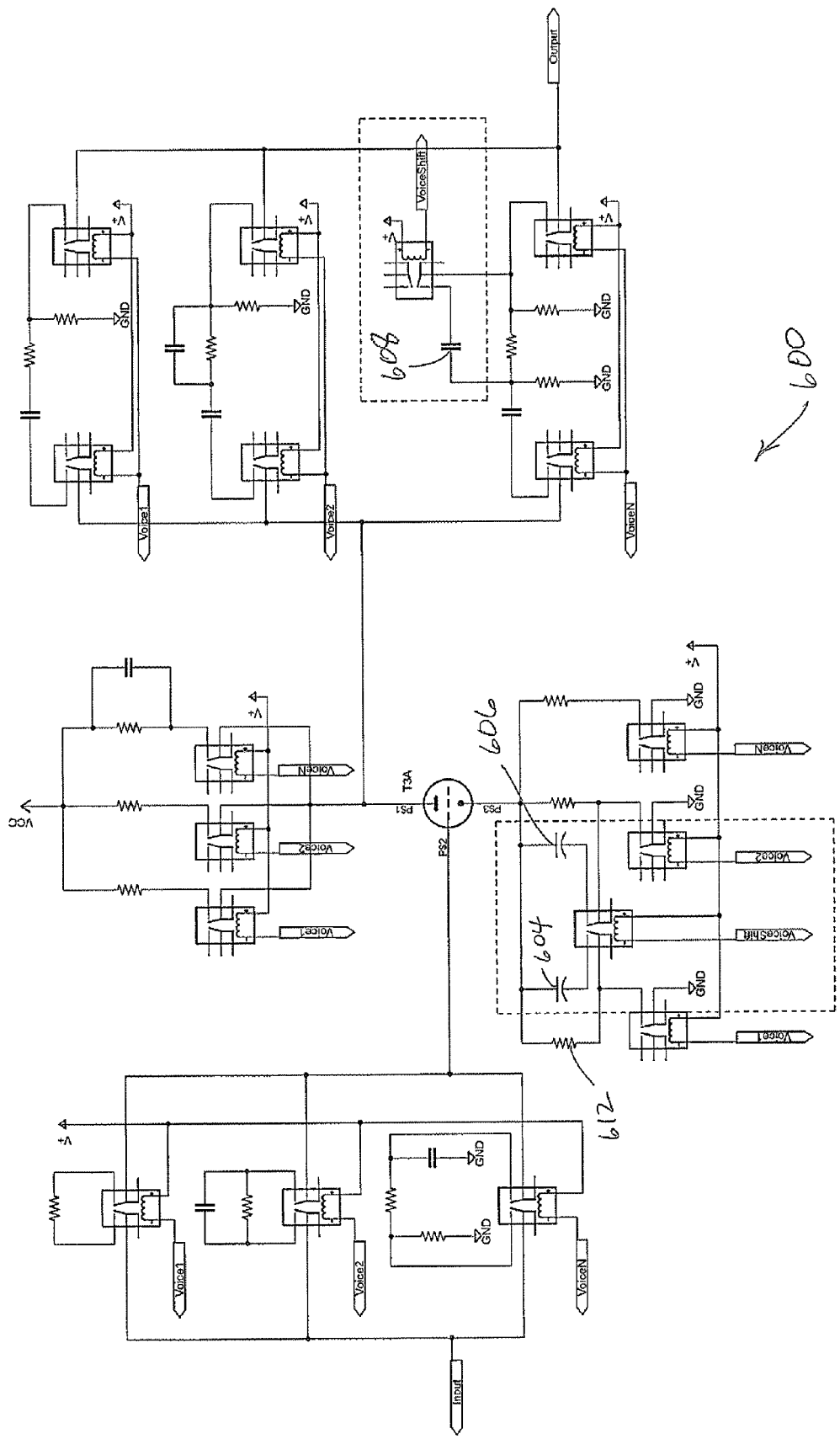
FIGS. 7 and 8 are diagrams of stage modules configured with voice shifts in accordance with various implementations of the disclosure.

As previously discussed, various amplifier system embodiments may provide voice shifts, which are voice-specific modifications to the amplifier circuit. Voice shifts are configured, e.g., by adding cathode bypass capacitors, emphasis capacitors, and/or de-emphasis capacitors. In some embodiments, each voice may have a voice shift for each stage. In other embodiments, a voice shift may be provided as a global feature for each voice. A stage module having a modular design in which a voice shift is included is indicated generally in FIG. 7 by reference number 600. Dashed lines indicate voice shift components of the module 600. In the present example, a switchable cathode bypass capacitor 604 is provided for voice shifting of Voice1, and a switchable cathode bypass capacitor 606 is provided for voice shifting of Voice2. A switchable emphasis capacitor 608 is provided for voice shifting of VoiceN. When the voice shift option is selected, all voice shift relays are switched on. However, only the voice shift related to the active voice is in the circuit. For example, if Voice1 is active when the voice shift is selected, the cathode bypass capacitor 604 is switched into place across a cathode resistor 612. The cathode bypass capacitor 606 for Voice2 is also switched across the cathode resistor 612. Because there is no path to ground when Voice2 is off, the resistor 612 and capacitor 604 are both bypassed. Similarly, the emphasis capacitor 608 for VoiceN is switched into the circuit but is isolated when VoiceN is off.

Figure 8:
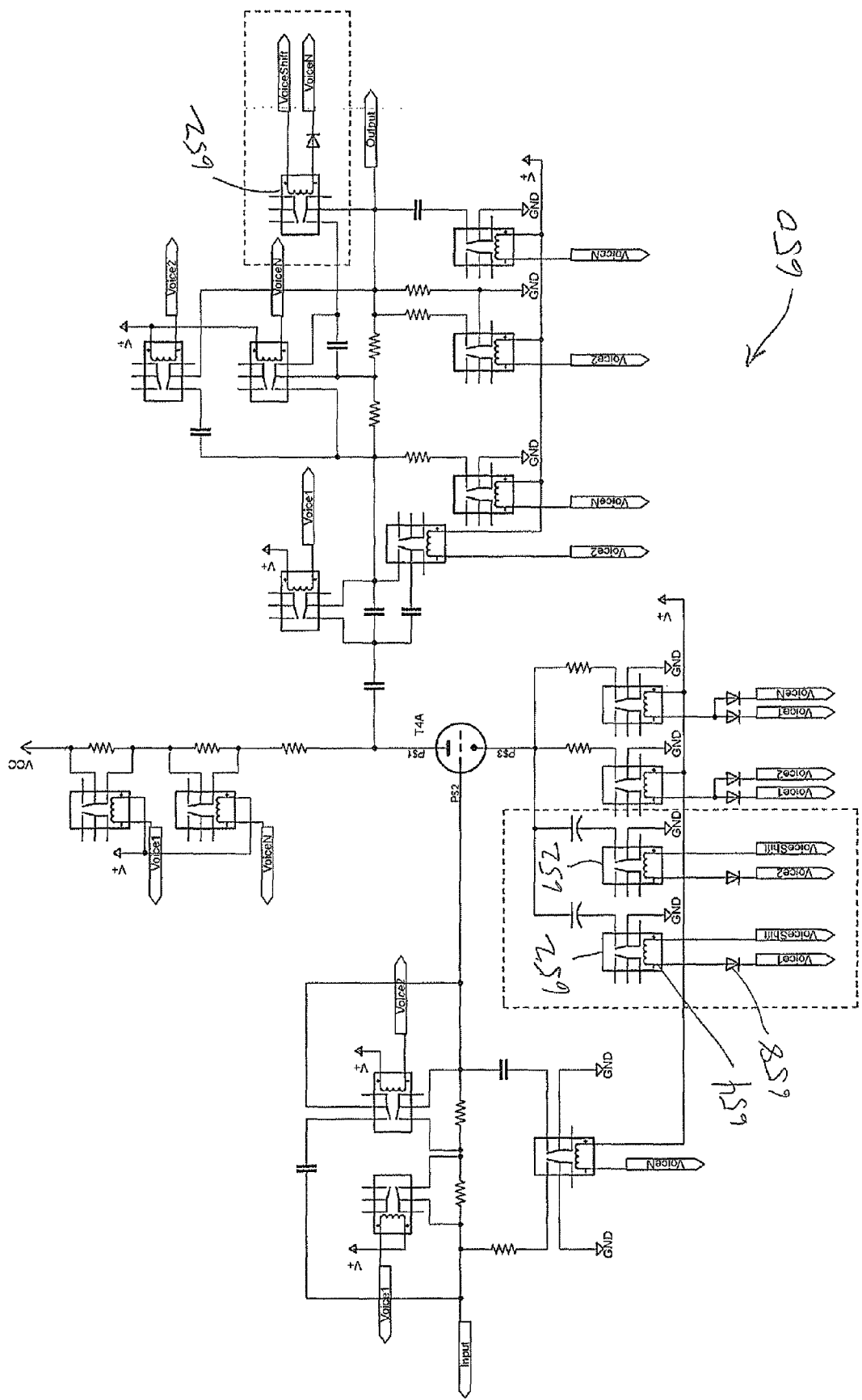

A stage module having a hybrid design in which a voice shift is included is indicated generally in FIG. 8 by reference number 650. In the module 650, a given voice and its voice shift share a relay 652. Negative pins 654 of voice shift relays 656 are connected to a corresponding voice bus through diodes 658. Relay positive pins 664 are attached to a voice shift bus. When voice shift is active, all relays 652 receive a positive voltage, but only relay(s) corresponding to the active voice have a path to ground. In other embodiments, a voice shift control bus could be provided for each voice.

Cuts may be selected to change attenuator value, to reduce gain from a stage. Like voice shifts, each cut is voice-specific. Cuts may be provided in the same or similar manner as voice shifts.

Figure 9:
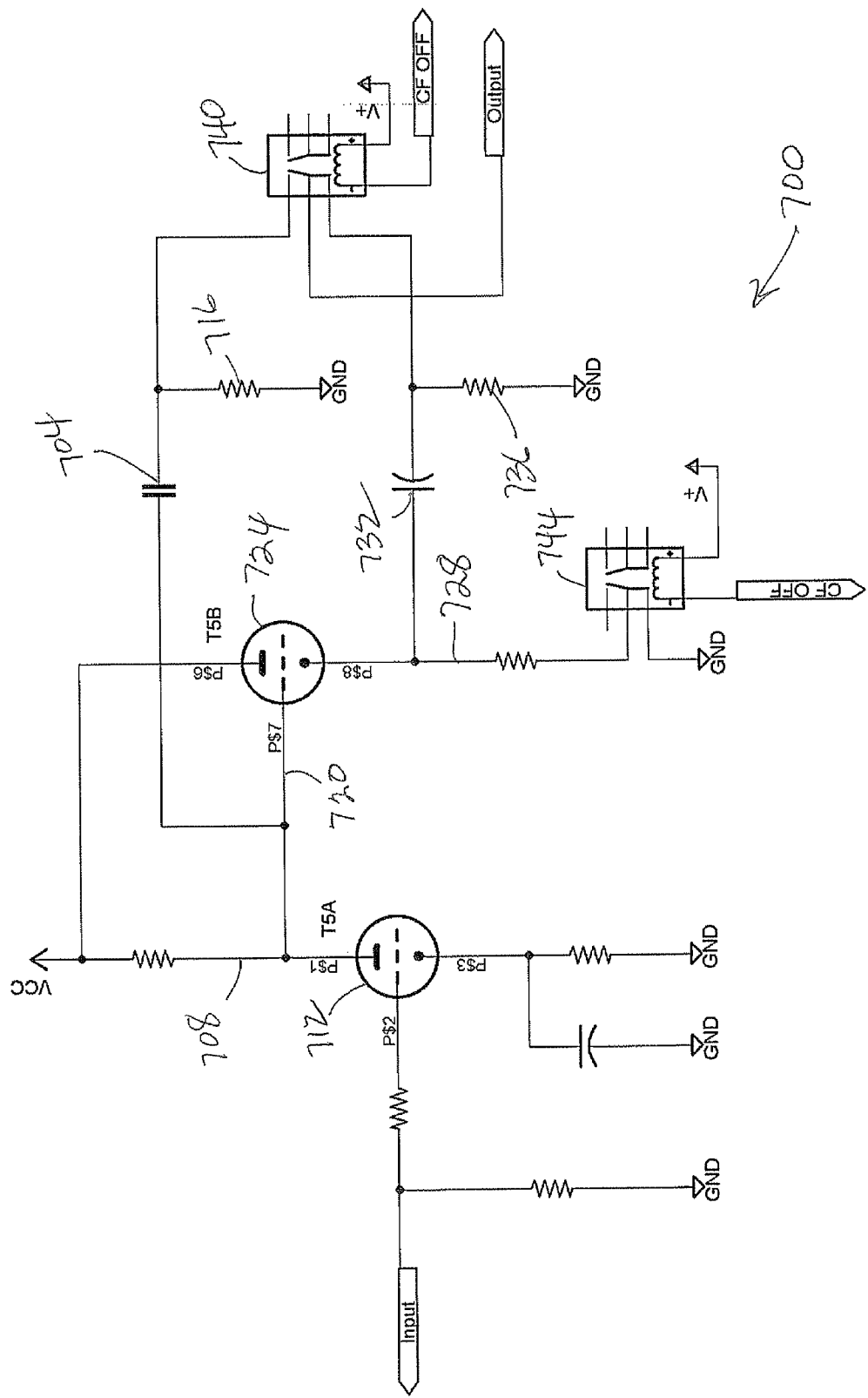
FIG. 9 is a diagram of a cathode follower configured in accordance with one implementation of the disclosure.

One example embodiment of a cathode follower is indicated generally in FIG. 9 by reference number 700. The cathode follower 700 is configured to be biased above a zero-volt grid curve so that it may constantly draw grid current. This typically has the effect of compressing the signal and adding even-order harmonics for a warm, smooth sound. In various embodiments, the cathode follower 700 is switchable. A coupling capacitor 704 is connected with an anode 708 of a first tube 712, which is connected to ground via a large-value resistor 716. The coupling capacitor 704 has a large capacitance, e.g., 100 nF, so that it does not affect a following equalizer circuit. The resistor 716 also has a large value, e.g., 1 MΩ, to prevent loading the driving stage much more than the equalizer circuit. A grid 720 of a second tube 724 is connected to the anode 708 of the first tube 712. The second tube 724 is wired as a traditional cathode follower. Its cathode 728 connects to a coupling capacitor 732, which is connected to ground via a large-value resistor 736. The coupling capacitor 732 is much larger in value than the capacitor 704 because the impedance of the cathode follower 700 is much lower than the anode. The coupling capacitor 732 may be, e.g., 22 uF and is sized to allow low frequencies to pass unaffected. The resistor 736 also has a large value, e.g., 1 MΩ, to prevent loading the driving stage much more than the equalizer circuit. A relay 740 is used to select either output. A relay 744 is switchable to remove the ground connection from the cathode 728 of the second tube 724 so that it does not draw current and load down the first tube 712. The cathode follower 700 is a "normally on" component, so that the coupling capacitor 704 can discharge when its amplifier is off.

Figure 10:
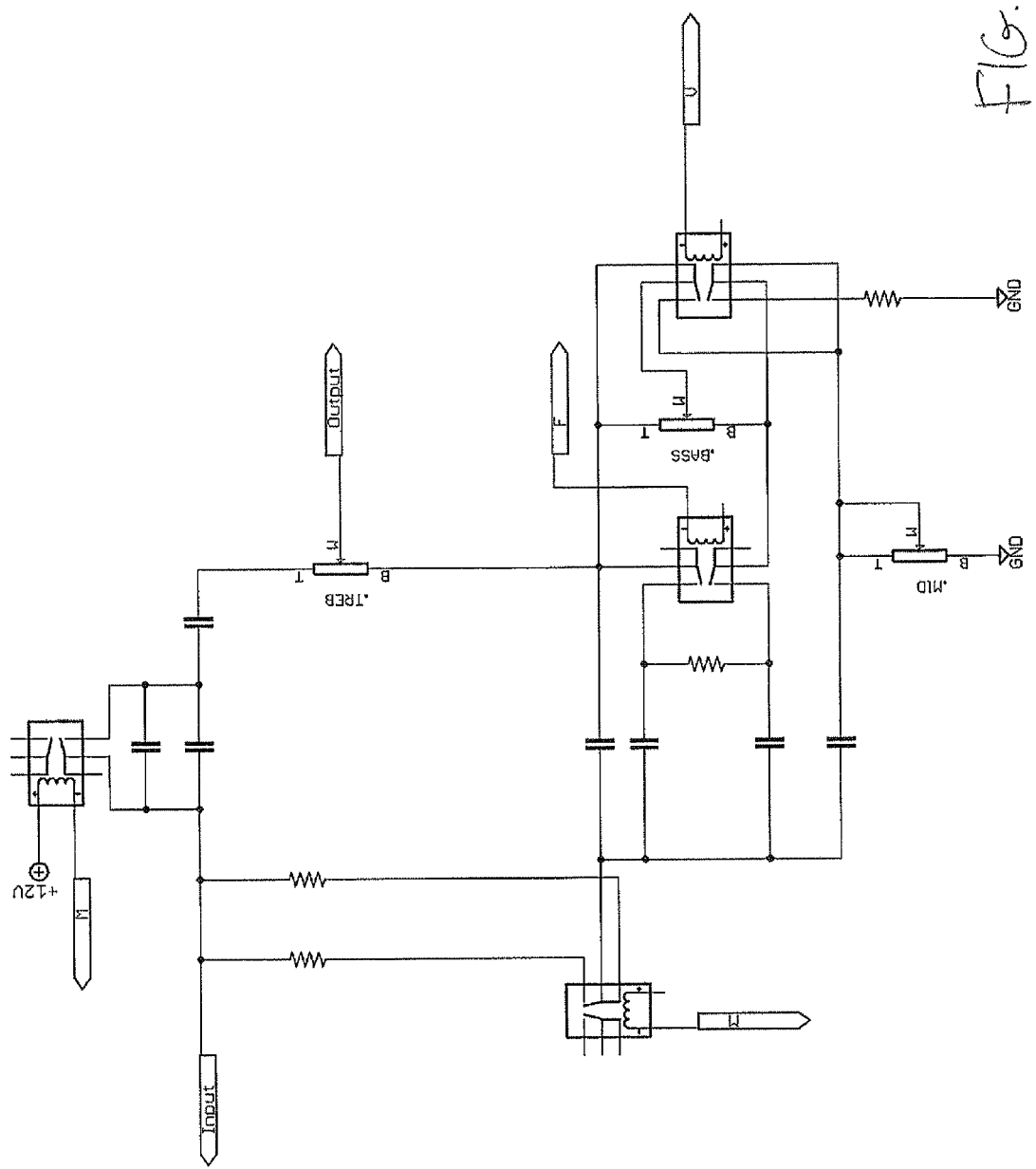
FIG. 10 is a diagram of a circuit for emulating tone stacks in accordance with one implementation of the disclosure.

Various embodiments of amplifier systems may provide equalizer circuits, also known as "tone stacks." Various tone stacks can affect different frequencies and can load their driving stages differently. In some embodiments, variable sections of such circuits may be controlled through panel controls, and so a potentiometer may be used as an integral part of a tone stack, providing user control over the tone stack itself. One example embodiment of a circuit for emulating three tone stacks is shown in FIG. 10. As with voice shifts, frequency shifts may be added to a tone stack circuit to emulate additional tone stack circuits. One example method of emulating a plurality of tone stacks includes selecting base tone stack circuits and providing a treble, mid, and bass shift for each, thereby multiplying selection possibilities.

Figure 11:
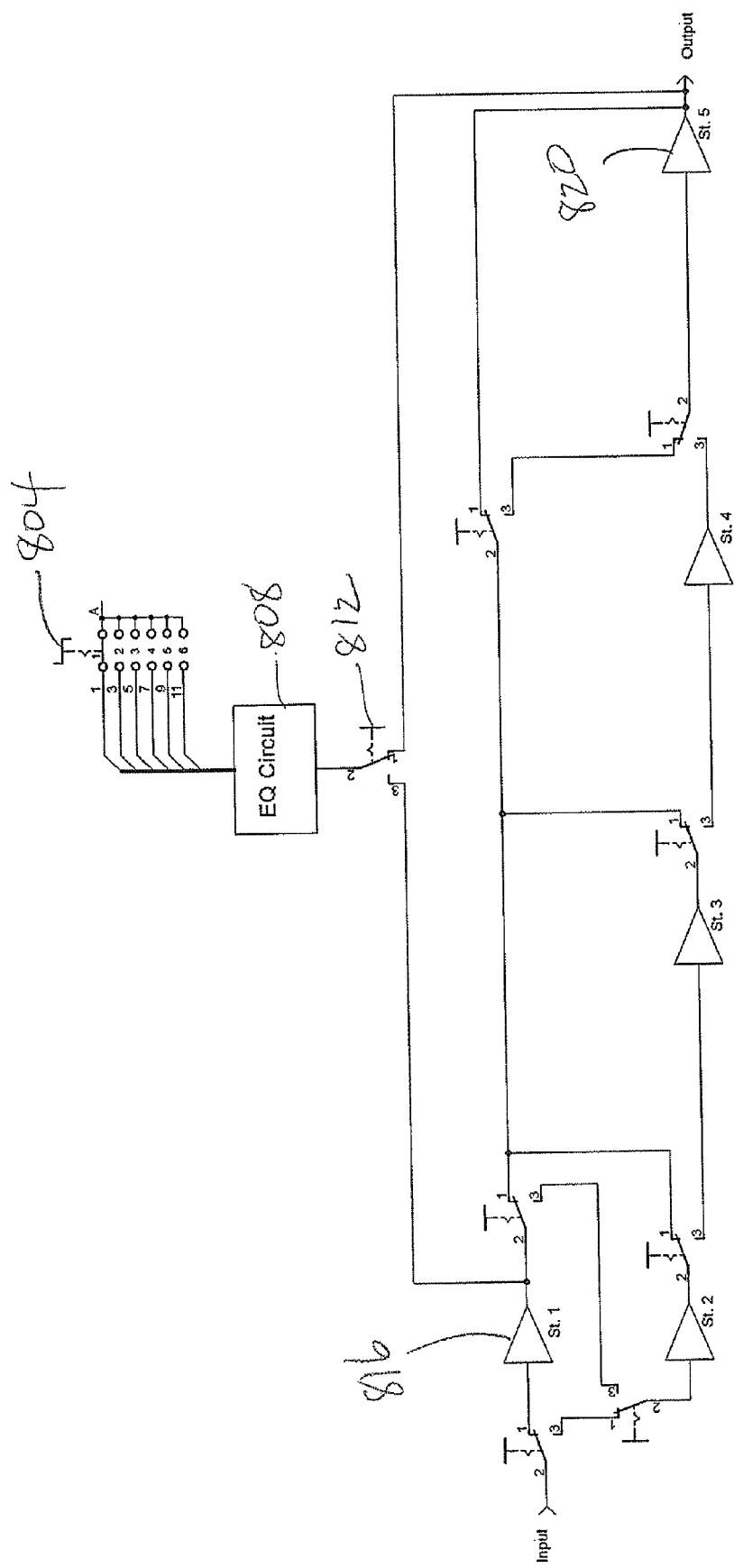
FIG. 11 is a diagram of an equalizer circuit configured in accordance with one implementation of the disclosure.

Equalizer circuits are typically found in one of two places in a guitar amplifier circuit: after a first stage, or after a last stage. Each position can have its own advantages and sound. In some embodiments, an equalizer position switch may be provided in relation to an equalizer circuit, e.g., as shown in FIG. 11. An equalizer circuit switch 704 may be provided in an amplifier system, e.g., as discussed with reference to FIG. 1, and may be used to select one of a plurality of equalizer circuits, a selected one of which is indicated by reference number 808. An equalizer position switch 812 may be used to connect the selected equalizer circuit 808 either after a first stage 816 or after a last stage 820. A ground connection for a selected tone stack may also be switched to an appropriate circuit location, e.g., to minimize noise and facilitate layout. An equalizer circuit after a first stage may be grounded, e.g., at a following stage's cathode. An equalizer circuit after a last stage may be grounded, e.g., at the output stage's cathode.

An amplifier system configured in accordance with aspects of the present disclosure may be controlled using analog and/or digital means. Where, for example, the amplifier system 20 of FIG. 1 is controlled digitally through, e.g., a microprocessor, a user may create his/her own amplifier designs and store presets of the amplifier circuits. When the user selects one of the presets, the system 20 automatically may switch on all stages for the selected preset at the same time. Additionally or alternatively, presets of classic and/or other known amplifiers may be stored and selected in the same or similar manner.

In some embodiments in which a microprocessor is used, input/output expanders may be provided to allow individual control of each relay in each stage. In such embodiments, it can be unnecessary to use diodes to control bussing as previously discussed. In such embodiments, it can be possible for a new amplifier to be emulated in the amplifier system by programming a relay combination, e.g., for controlling voice components already included for emulating other amplifiers in the system.

Figure 12A:
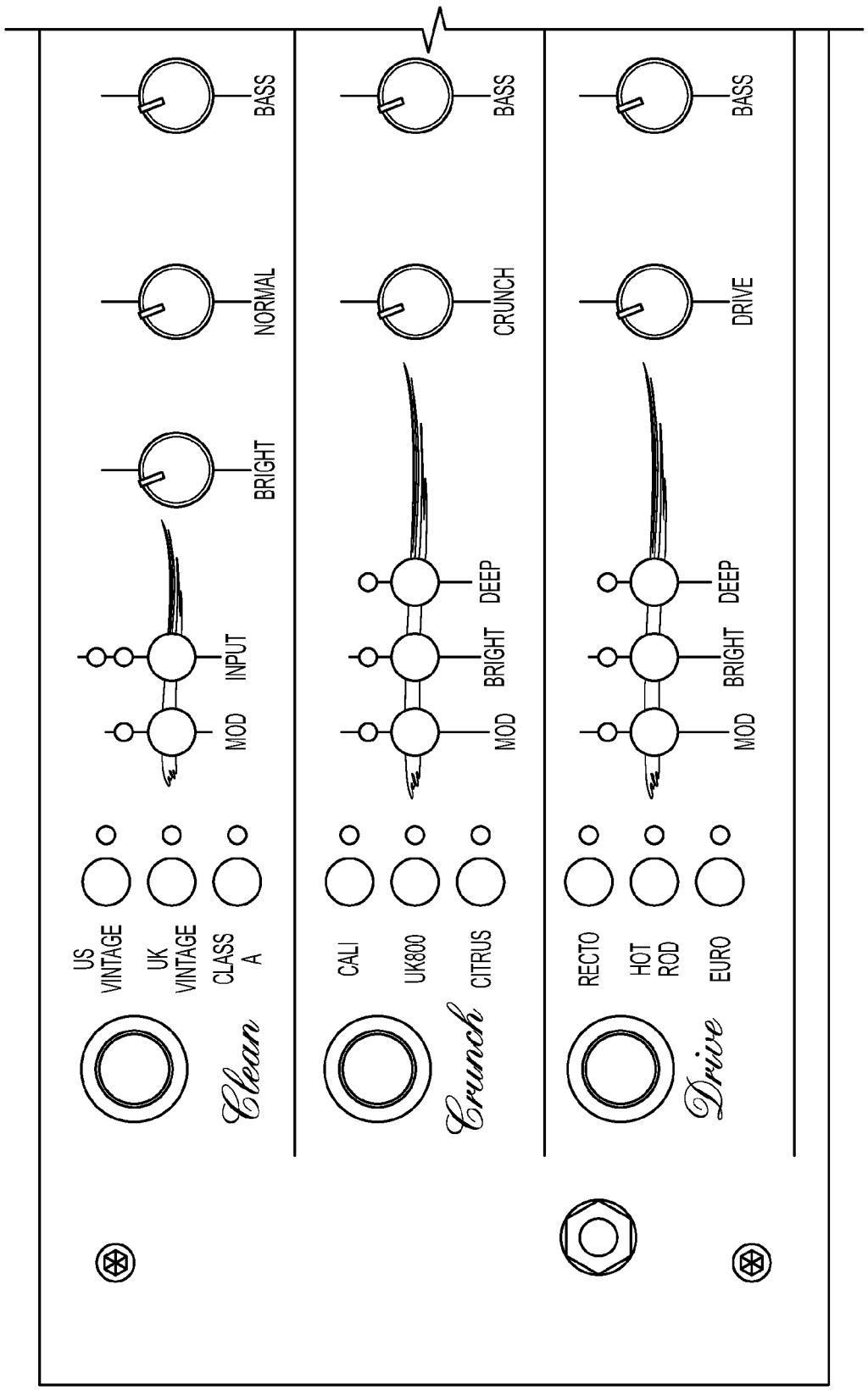
FIGS. 12A and 12B are illustrations of amplifier system control surfaces in accordance with various implementations of the disclosure.
Figure 12A:
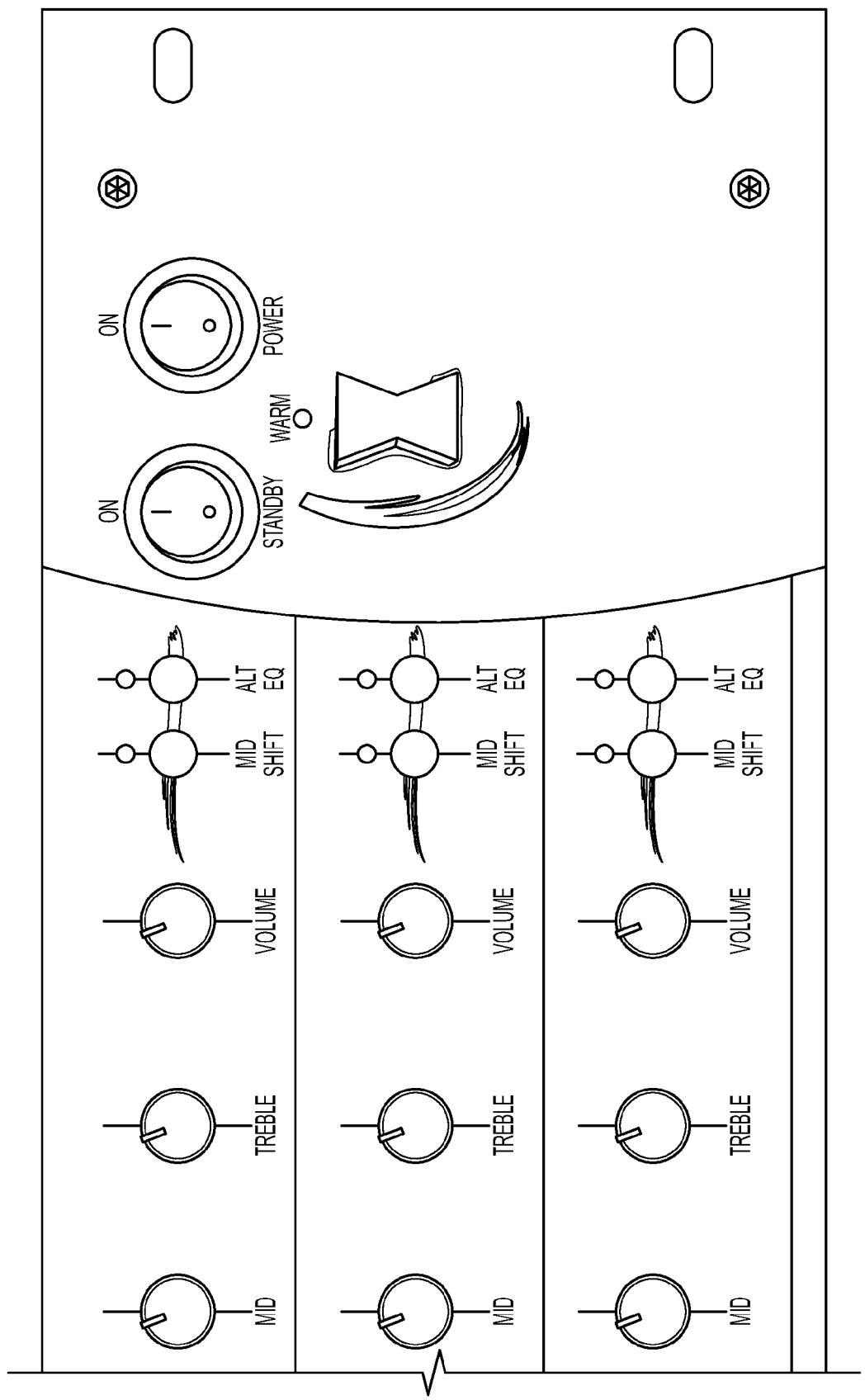
Figure 12B:
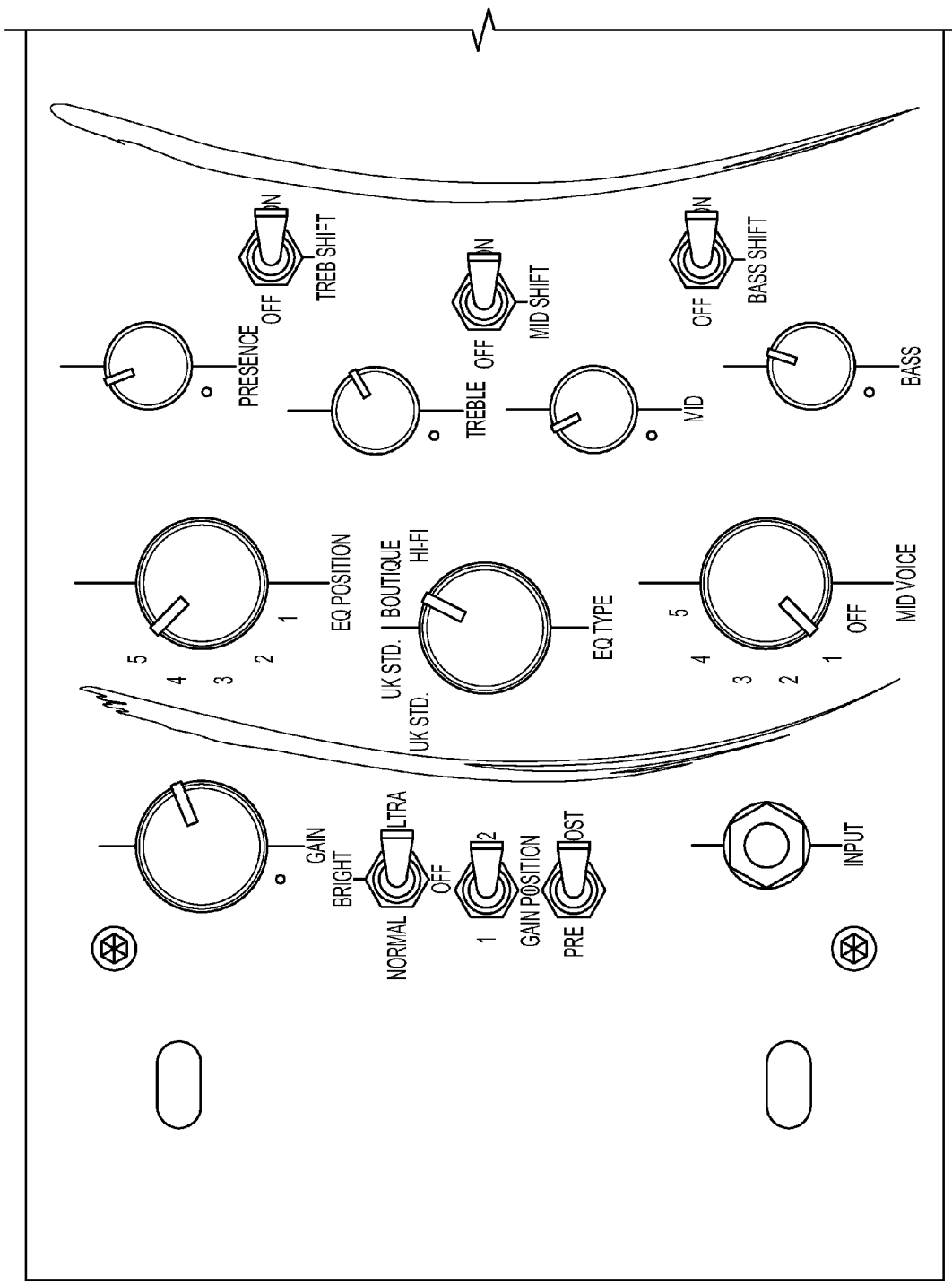
Figure 12B:
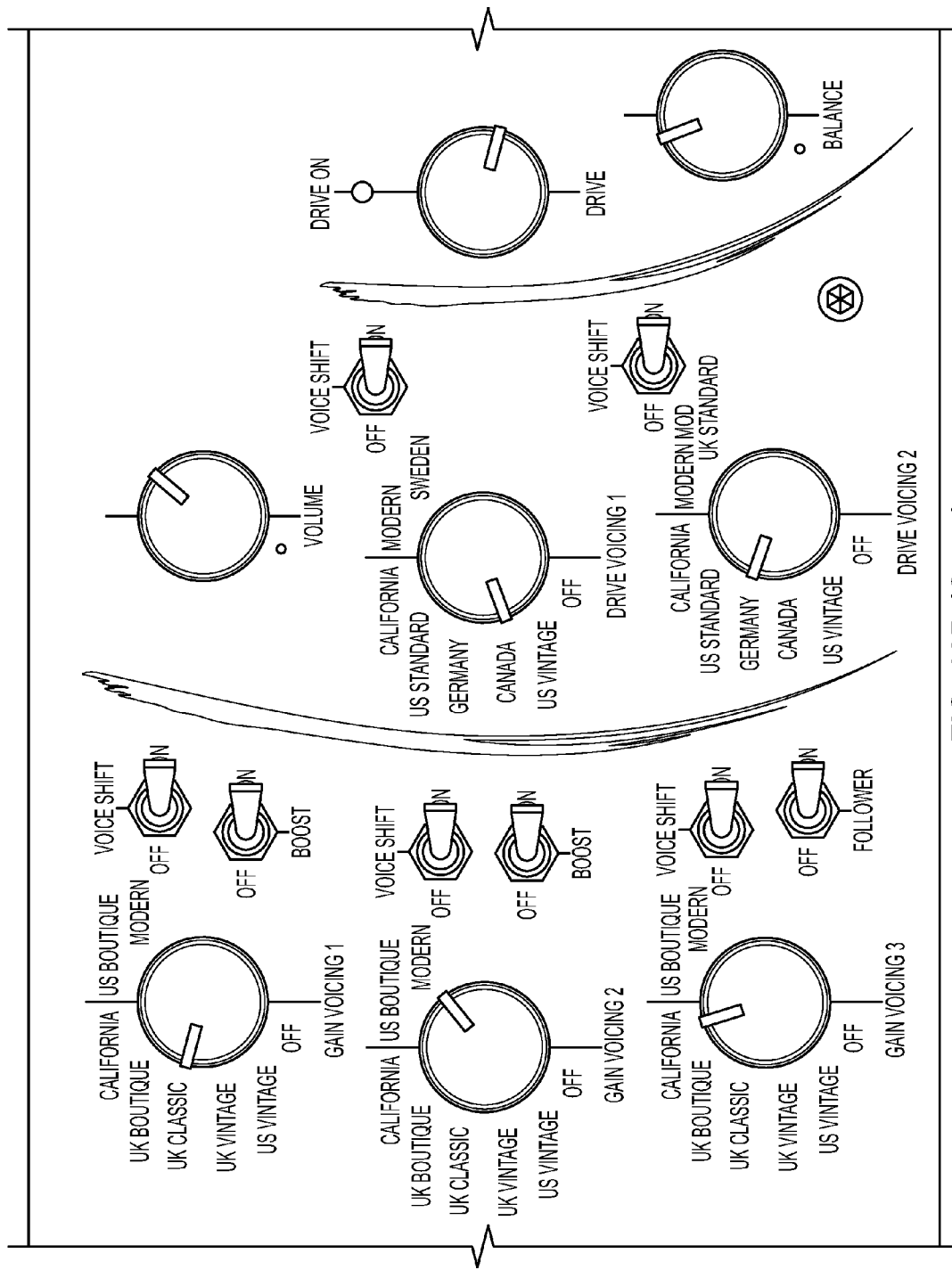
Figure 12B:
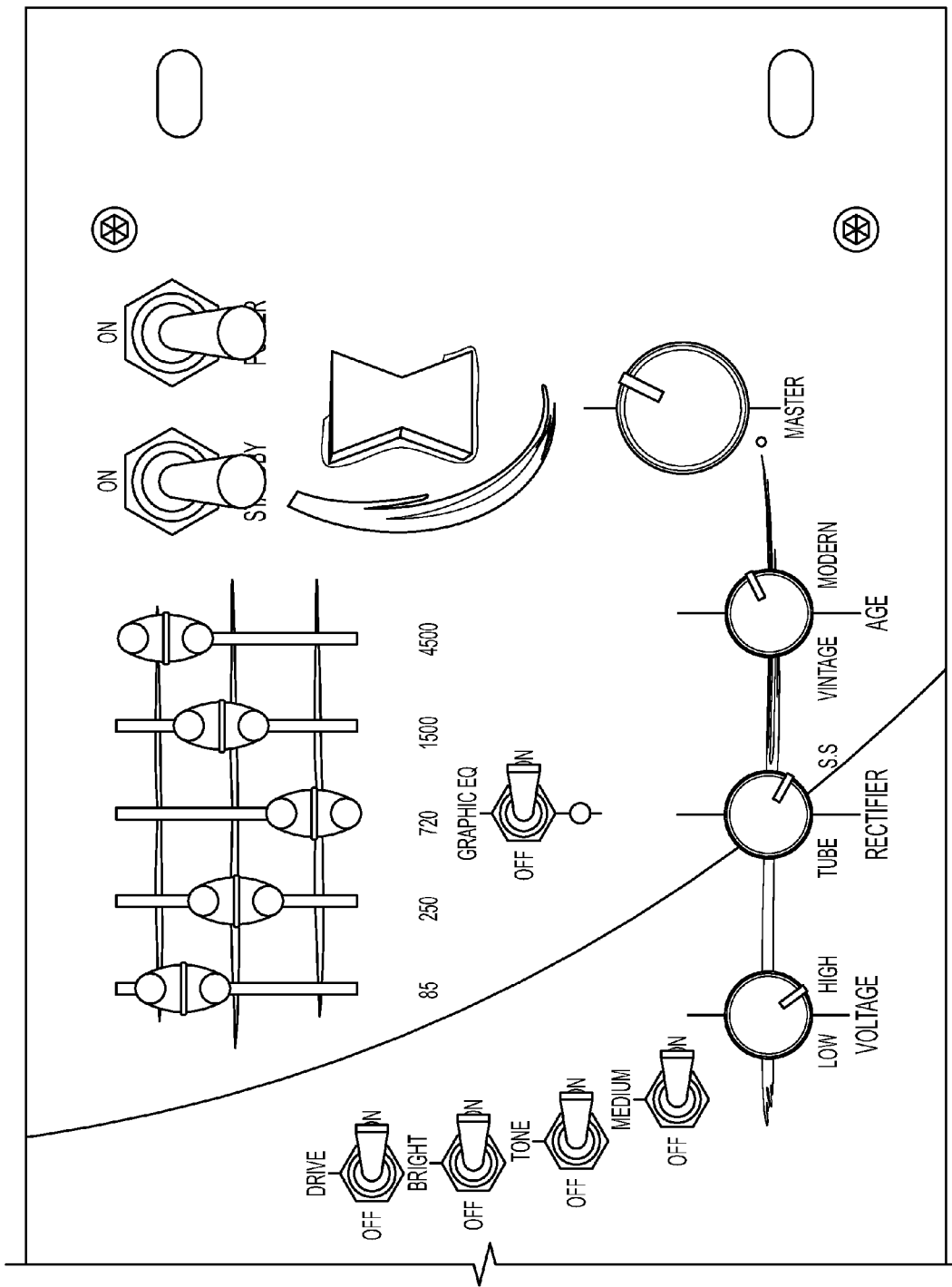

In various embodiments, analog and/or digital controls may be included. Example embodiments of control surfaces are shown in FIGS. 12A and 12B. In various embodiments, analog controls may be included, e.g., for gain, equalizer, and/or volume control. In some example embodiments in which a microprocessor is included, control knob settings may be preset, stored in memory and implemented, e.g., through motorized potentiometers. The microprocessor may also be configured to sense a position of a control knob and store a corresponding control value for later use.

In various amplifier systems in accordance with embodiments of the disclosure, a multichannel amplifier control surface may be provided on which each channel has its own dedicated controls. Relays may be used to select which controls are active by routing the amplifier signal to the appropriate channel's controls. In some other embodiments, a single set of channel controls may be shared by amplifier sounds. Motorized potentiometers may be used to move the controls to stored positions for a change of a channel and/or voice.

Many if not most conventional amplifiers have multiple channels, e.g., clean, crunch and lead tones. In various implementations, an amplifier system may be configured to emulate most if not all known amplifiers and their channels. In some embodiments, an amplifier system may cause all channel options for a user-selected sound to be loaded and accessible, e.g., in response to the user pushing a button. Where digital controls are used, there is no need to limit an amplifier system to only one voice for all channels. For example, a user may load one of one or more "phantom" channels emulated for a first voice into a first channel, one of one or more "phantom" channels emulated for a second voice into a second channel, etc. Where "phantom" channels can be accessed, e.g., by a footswitch, they may be used in live and/or studio environments. In addition to or instead of control surfaces such as those shown in FIGS. 12A and 12B, in various embodiments a computer may be used to control an amplifier system via software. Such capability may facilitate the creation of new amplifiers by users, who can choose a topology, number of gain stages, and which voicing to use for each stage. When the user has selected a voicing option, the amplifier system hardware automatically configures it into the system as described above. In some embodiments, mechanical controls such as rotary knobs could be set and moved through software. In one example embodiment, amplifier software may be linked to software of a digital audio workstation (DAW) and may perform as a plug-in. A workstation user may control the internal state of the amplifier, e.g., to correspond to position in a song. If, for example, the software calls for a new voice to be used for a song chorus, a channel change could take place automatically at the chorus. Additionally or alternatively, volume swells and knob movements could be programmed so that they would take place in real time at various points in a song.

The foregoing amplifier systems and methods make it possible for users to emulate their favorite guitar amplifiers with analog circuitry values used in the originals. Users also may, if so inclined, create and store their own amplifier sounds as presets that can be conveniently recalled and used. When digital circuitry is used for controls, it can be possible to use fewer analog components. The feel and dynamics of tube circuitry are maintained. The foregoing systems are compact and require little floor space, compared to floor space needed for storing a plurality of conventional tube amplifiers.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A preamplifier stage module circuit comprising:
   an anode section, a grid section, a cathode section, an attenuator section, and a tube connected with the anode, grid, cathode, and attenuator sections;
   the preamplifier stage module circuit selectively configurable to provide an output signal having any one of a plurality of selectable voices, each voice provided by a corresponding combination of selectively combinable voice components of the anode, grid, cathode, and attenuator sections, the voice components selectively connectable to the tube anode, grid and cathode to provide a selected one of the voices by (a) biasing the tube to produce, from an input signal to the preamplifier stage module circuit that includes the tube, a signal having a harmonic spectrum and gain that are specific to the preamplifier stage module circuit and specific to the selected voice, and (b) shaping the harmonic spectrum and gain to provide the selected voice in the output signal from the preamplifier stage module circuit.

2. The preamplifier stage module circuit of claim 1, wherein one of the voice components is combinable in a first configuration of the preamplifier stage module circuit to provide a first voice and is combinable in a second configuration of the preamplifier stage module circuit to provide a second voice.

3. The preamplifier stage module circuit of claim 1, further comprising a cathode follower circuit selectively switchable into or out of the preamplifier stage module circuit.

4. The preamplifier stage module circuit of claim 1, wherein the voices share at least some of the voice components.

5. An amplifier system comprising the preamplifier stage module circuit of claim 1.

6. The preamplifier stage module circuit of claim 1, wherein each voice emulates a different stage model.

7. The preamplifier stage module circuit of claim 1, further comprising a plurality of voice shifts corresponding to the voices.

8. The preamplifier stage module circuit of claim 1, wherein the voices are emulations of a plurality of stage models, the preamplifier stage module circuit further configurable with one or more additional preamplifier stage module circuits to emulate a plurality of channels of the stage models.

9. An amplifier system comprising:
   a plurality of user-selectable preamplifier stage modules, each stage module having an anode section, a grid section, a cathode section, an attenuator section, and a tube connected with the anode, grid, cathode, and attenuator sections, at least some of the stage modules combinable to provide a user-selected sound of the amplifier system;
   each stage module selectively configurable to provide any one of a plurality of selectable voices of the stage module, each voice provided by a corresponding combination of selectively combinable voice components of the anode, grid, cathode, and attenuator sections of the stage module;
   the voice components of a given stage module being selectively connectable to the tube anode, grid and cathode of the given stage module to provide a given voice of the given stage module by (a) receiving an input signal and biasing the tube of the given stage module to produce, from the input signal, a signal having a harmonic spectrum and gain that are specific to the given stage module and specific to the selected voice, and (b) shaping the harmonic spectrum and gain to produce an output signal from the given stage module, the output signal having the given voice;
   the given stage module further configurable to receive the input signal from a preceding one, if any, of the preamplifier stage modules and/or to provide the output signal as an input signal to a following one, if any, of the preamplifier stage modules.

10. The amplifier system of claim 9, wherein one of the voice components is combinable in a first configuration of a stage module to provide a first voice and is combinable in a second configuration of the stage module to provide a second voice.

11. The amplifier system of claim 9, wherein the selectively combinable voice components for a given voice are not shared by the other voices.

12. The amplifier system of claim 9, wherein the voice components comprise one or more resistors and one or more capacitors.

13. The amplifier system of claim 9, wherein a given stage module further comprises a cathode follower section selectively switchable into or out of the given stage module.

14. The amplifier system of claim 9, further comprising an equalizer circuit having a position switch whereby the equalizer circuit is selectively connectable to the stage modules after the first or after the last stage module.

15. The amplifier system of claim 9, wherein a given stage module further comprises a voice shift circuit selectively switchable into or out of the given stage module.

16. The amplifier system of claim 15, wherein activation of the voice circuit activates a voice shift only for an active voice of the given stage module.

17. The amplifier system of claim 9, wherein the selectable voices are emulations of a plurality of stage models, the system further configured to emulate a plurality of channels of the stage models.

18. A method of making an amplifier system, the method comprising:
  in each of a plurality of preamplifier stage modules, providing an anode section, a grid section, a cathode section, an attenuator section, and a tube in connection with each of the anode, grid, cathode, and attenuator sections;
  providing the anode, grid, cathode, and attenuator sections of each preamplifier stage module with a plurality of voice components selectively connectable to the tube anode, grid and cathode in the preamplifier stage module to provide any one of a plurality of selectable voices in an output signal of the preamplifier stage module, where providing a selected one of the voices includes (a) biasing the tube to produce, from an input signal to the preamplifier stage module that includes the tube, a signal having a harmonic spectrum and gain that are specific to the preamplifier stage module and specific to the selected one of the voices, and (b) shaping the harmonic spectrum and gain to provide the selected one of the voices in the output signal.

19. The method of claim 18, further comprising:
  making a given voice component configurable in a given preamplifier stage module to provide a first voice component value for a first one of the voices and configurable in the given preamplifier stage module to provide a second component value for a second one of the voices; and
  providing a selection switch for selecting one of the voices of the given preamplifier stage module.

20. The method of claim 18, further comprising:
  selecting amplifier sounds to be provided by the system;
  for each selected sound, determining a plurality of stages for providing the sound, and determining circuit values for each stage; and
  providing in a given preamplifier stage module the voice component circuit values for corresponding stages determined to provide the selected sounds, the providing performed by configuring at least one voice component in the module to provide more than one of the circuit values.

\* \* \* \* \*